United States Patent
Karda et al.

(10) Patent No.: US 11,653,489 B2
(45) Date of Patent: May 16, 2023

(54) MEMORY DEVICE HAVING 2-TRANSISTOR VERTICAL MEMORY CELL AND SHIELD STRUCTURES

(71) Applicant: Micron Technology, Inc., Boise, ID (US)

(72) Inventors: Kamal M. Karda, Boise, ID (US); Haitao Liu, Boise, ID (US); Karthik Sarpatwari, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/003,054

(22) Filed: Aug. 26, 2020

(65) Prior Publication Data

US 2021/0066302 A1   Mar. 4, 2021

Related U.S. Application Data

(60) Provisional application No. 62/893,023, filed on Aug. 28, 2019.

(51) Int. Cl.
*H01L 27/108* (2006.01)
*H01L 29/24* (2006.01)
*G11C 5/06* (2006.01)

(52) U.S. Cl.
CPC ........ *H01L 27/10802* (2013.01); *G11C 5/063* (2013.01); *H01L 27/10844* (2013.01); *H01L 29/24* (2013.01)

(58) Field of Classification Search
CPC ......... H01L 27/10802; H01L 27/10844; H01L 29/24; H01L 29/78642; H01L 29/7869;
(Continued)

(56) References Cited

U.S. PATENT DOCUMENTS

| | | | | |
|---|---|---|---|---|
| 5,357,464 | A | * | 10/1994 | Shukuri ................ H01L 27/108 365/185.21 |
| 2008/0144384 | A1 | | 6/2008 | Pham et al. |
| 2009/0283821 | A1 | * | 11/2009 | Nakao ............... H01L 21/76232 257/E21.21 |

FOREIGN PATENT DOCUMENTS

| | | |
|---|---|---|
| CN | 114503201 A | 5/2022 |
| JP | H05110016 | 4/1993 |

(Continued)

OTHER PUBLICATIONS

"Taiwanese Application Serial No. 109129640, First Office Action dated Jan. 22, 2022", w/ English translation, 5 pgs.

(Continued)

*Primary Examiner* — Edward Chin
(74) *Attorney, Agent, or Firm* — Schwegman Lundberg & Woessner, P.A.

(57) ABSTRACT

Some embodiments include apparatuses and methods of forming the apparatuses. One of the apparatuses includes a conductive region, a first data line, a second data line, a first memory cell coupled to the first data line and the conductive region, a second memory cell coupled to the second data line and the conductive region, a conductive structure, and a conductive line. The first memory cell includes a first transistor coupled to a second transistor, the first transistor including a first charge storage structure. The second memory cell includes a third transistor coupled to a fourth transistor, the third transistor including a second charge storage structure. The conductive structure is located between and electrically separated from the first and second charge storage structures. The conductive line forms a gate of each of the first, second, third, and fourth transistors.

22 Claims, 26 Drawing Sheets

(58) Field of Classification Search
CPC .. H01L 29/66969; G11C 5/063; G11C 11/404
See application file for complete search history.

(56) References Cited

FOREIGN PATENT DOCUMENTS

| TW | 202123428 | 6/2021 | | |
|---|---|---|---|---|
| WO | 2019066927 | 4/2019 | | |
| WO | WO-2019066927 A1 * | 4/2019 | ....... | H01L 27/10814 |
| WO | 2021041563 | 3/2021 | | |

OTHER PUBLICATIONS

"Taiwanese Application Serial No. 109129640, Response filed Jan. 11, 2022 to First Office Action dated Jul. 30, 2021", w/English Claims.
"Taiwanese Application Serial No. 109129640, First Office Action dated Jul. 30, 2021", w English Translation, 12 pgs.
"International Application Serial No. PCT US2020 048028, International Search Report dated Dec. 4, 2020", 3 pgs.
"International Application Serial No. PCT US2020 048028, Written Opinion dated Dec. 4, 2020", 5 pgs.
"International Application Serial No. PCT/US2020/048028, International Preliminary Report on Patentability dated Mar. 10, 2022", 7 pgs.
"Taiwanese Application Serial No. 109129640, Response filed Apr. 18, 2022 to First Office Action dated Jan. 22, 2022", w/English Claims, 9 pgs.

* cited by examiner

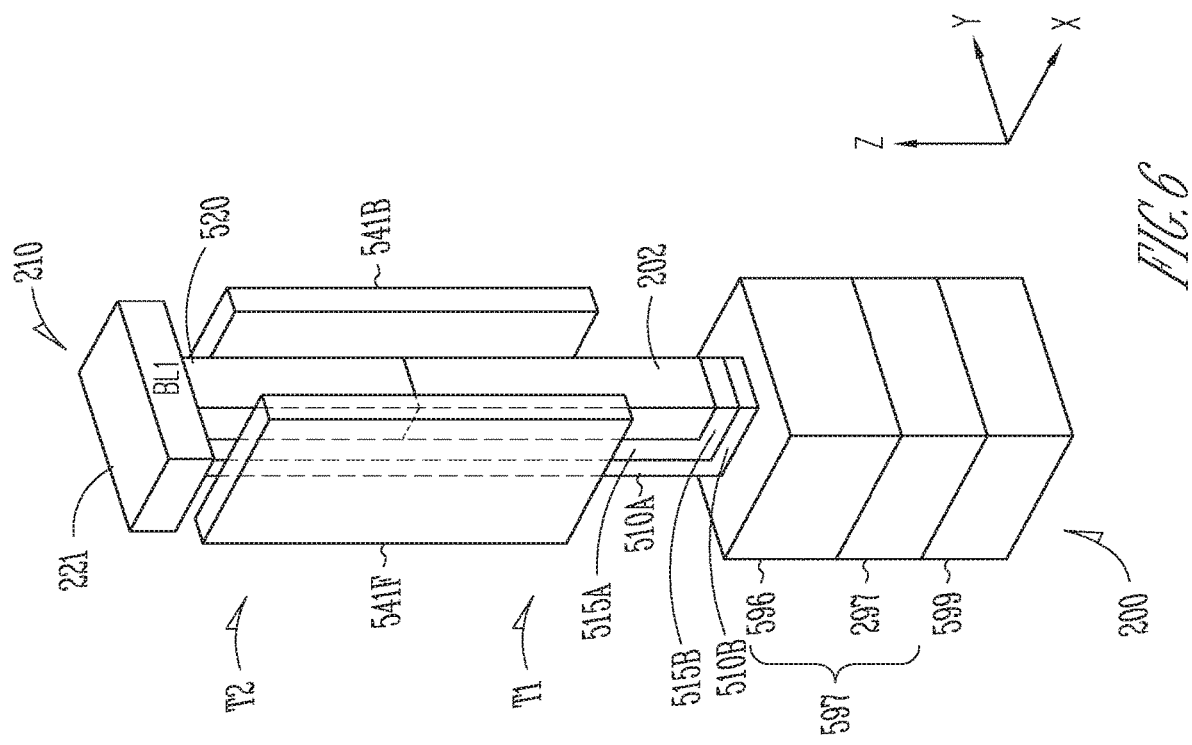
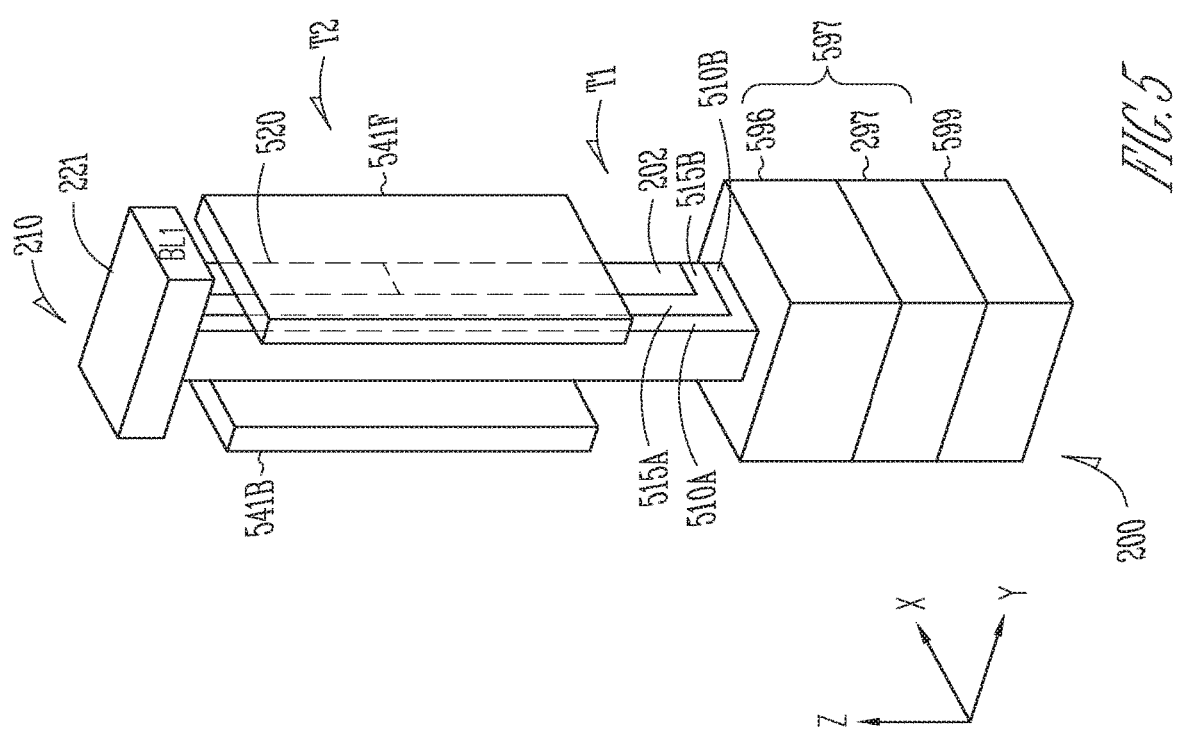

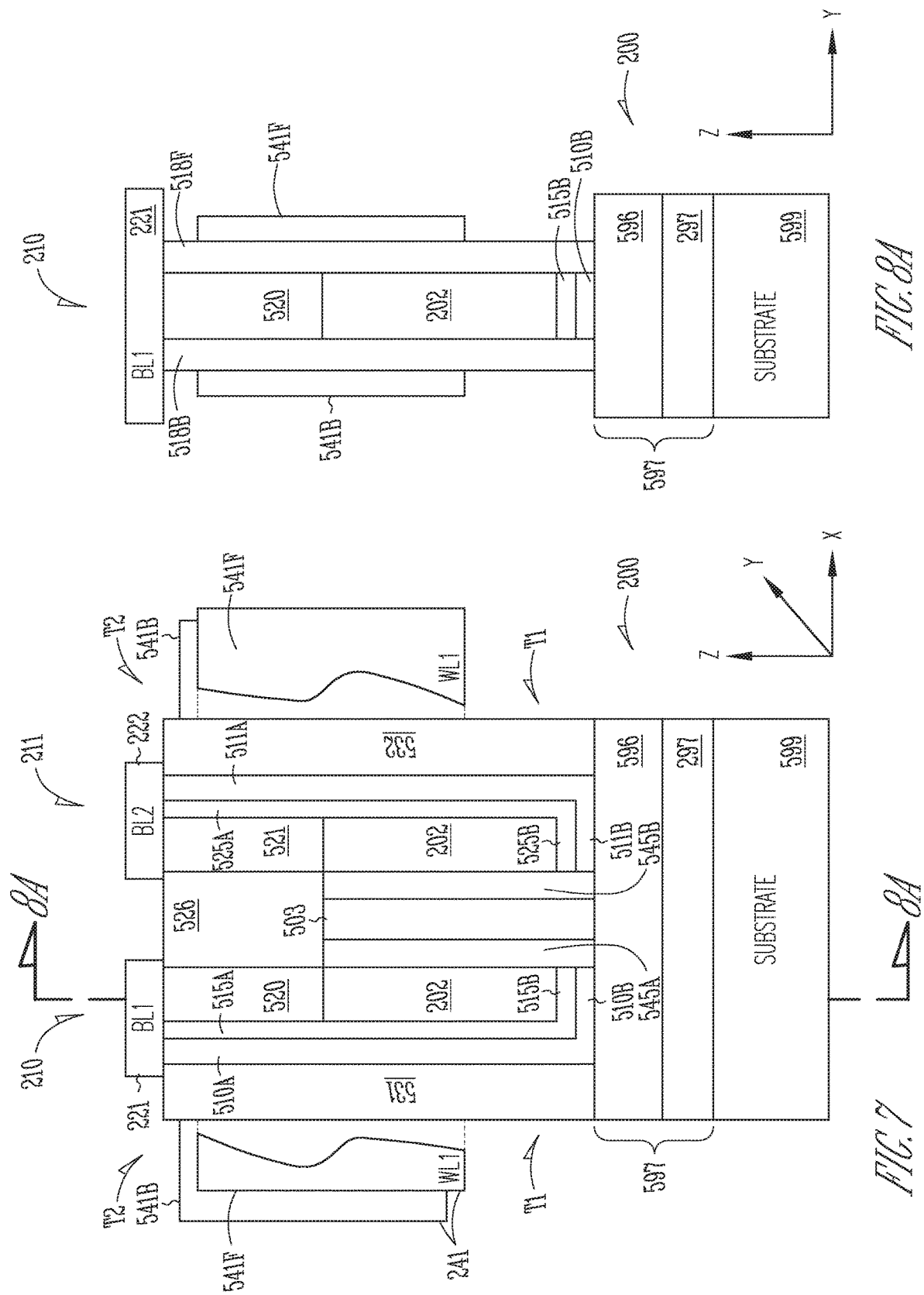

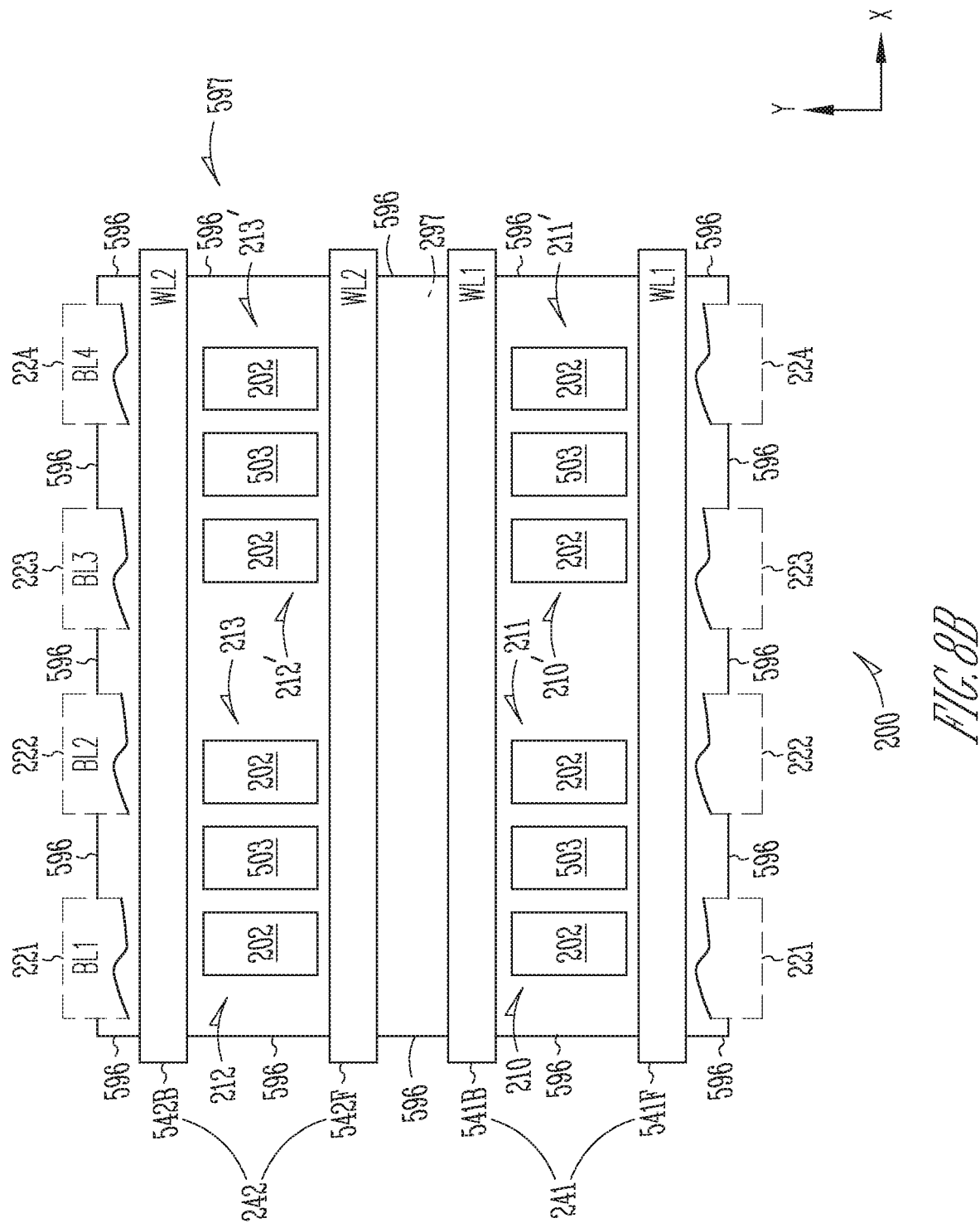

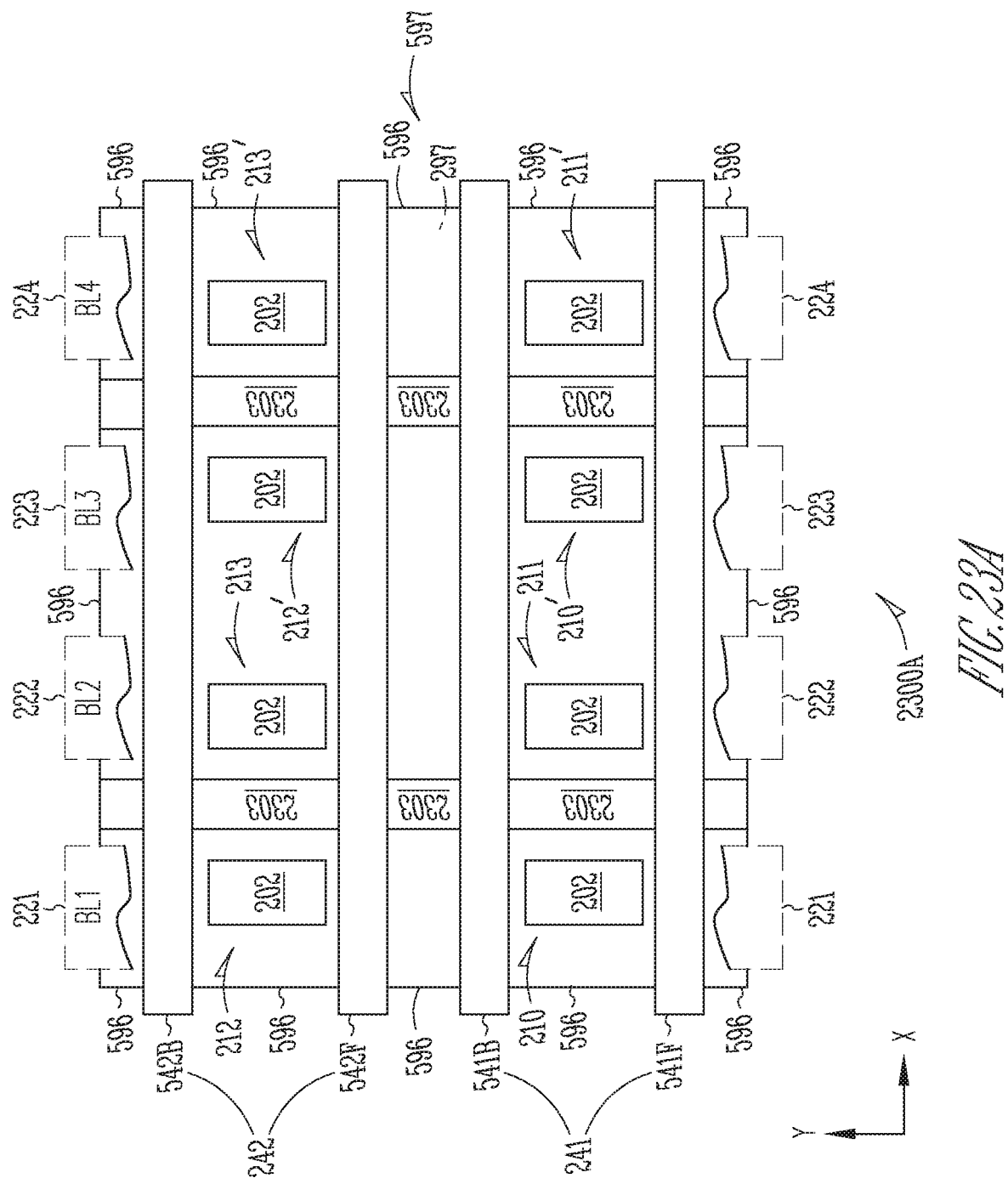

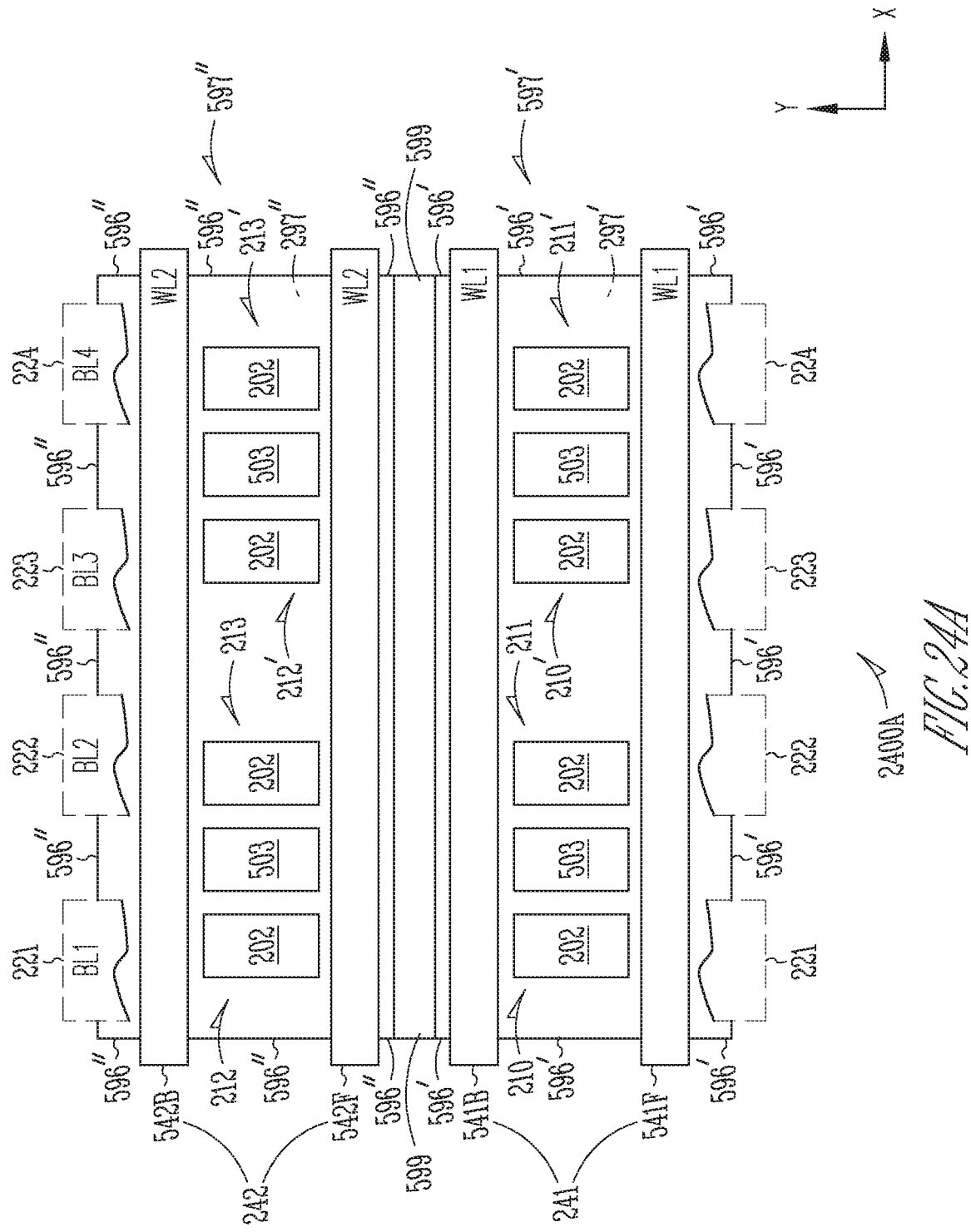

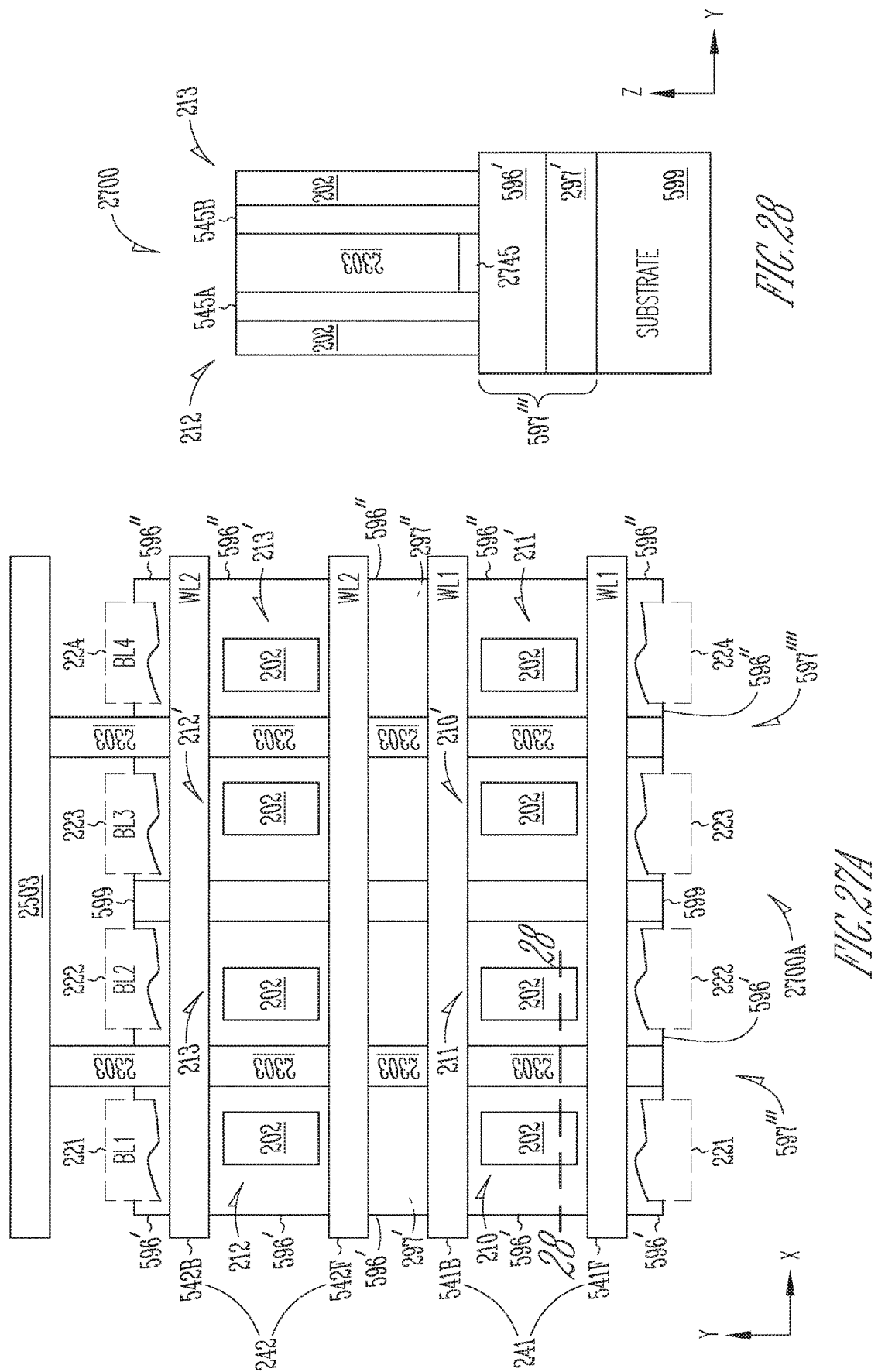

US 11,653,489 B2

MEMORY DEVICE HAVING 2-TRANSISTOR VERTICAL MEMORY CELL AND SHIELD STRUCTURES

PRIORITY APPLICATION

This application claims the benefit of priority to U.S. Provisional Application Ser. No. 62/893,023, filed Aug. 28, 2019, which is incorporated herein by reference in its entirety.

BACKGROUND

Memory devices are widely used in computers and many other electronic items to store information. Memory devices are generally categorized into two types: volatile memory device and non-volatile memory device. A memory device usually has numerous memory cells in which to store information. In a volatile memory device, information stored in the memory cells is lost if supply power is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Further, increased device storage density for a given area may cause excessive capacitive coupling between elements of adjacent memory cells. Unlike some conventional memory devices, the memory devices described herein include features that can overcome challenges faced by conventional techniques.

BRIEF DESCRIPTION OF THE DRAWINGS

FIG. 5, FIG. 6, FIG. 7, FIG. 8A, and FIG. 8B show different views of a structure of the memory device of FIG. 2, according to some embodiments described herein.

FIG. 23A through FIG. 28 show structures of additional memory devices that can be variations of the memory device of FIG. 2 through FIG. 8B, according to some embodiments described herein.

DETAILED DESCRIPTION

The memory device described herein includes volatile memory cells in which each of the memory cells can include two transistors (2T). One of the two transistors has a charge storage structure, which can form a memory element of the memory cell to store information. The memory device described herein can have a structure (e.g., a 4F2 cell footprint) that allows the size of the memory device to be relatively smaller than the size of similar conventional memory devices. The described memory device can include a single access line (e.g., word line) to control two transistors of a memory cell. This can lead to reduced power dissipation and improved processing. The described memory device can include shield structures between charge storage structures of adjacent memory cells. The shield structures can reduce capacitive coupling between adjacent charge storage structures of adjacent memory cells. A reduction in capacitive coupling between adjacent charge storage structures can improve operation (e.g., improve read signal margin) of the described memory device. Each of the memory cells of the described memory device can include a cross-point gain cell structure (and cross-point operation), such that a memory cell can be accessed using a single access line (e.g., word line) and single data line (e.g., bit line) during an operation (e.g., a read or write operation) of the memory device. Other improvements and benefits of the described memory device and its variations are discussed below with reference to FIG. 1 through FIG. 29C.

Figure 1:
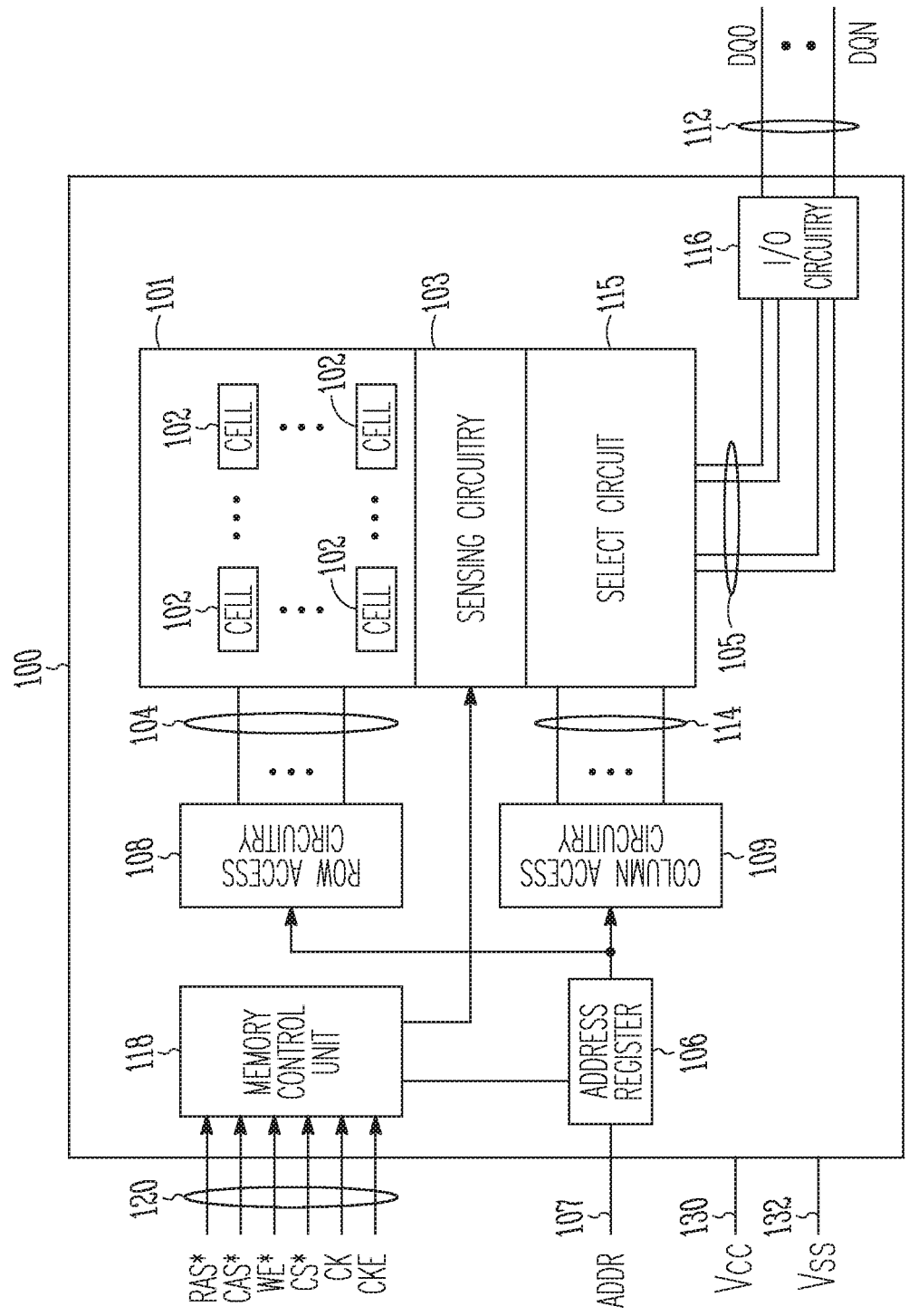
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 can include a volatile memory device such that memory cells 102 can be volatile memory cells. An example of memory device 100 includes a dynamic random-access memory (DRAM) device. Information stored in memory cells 102 of memory device 100 may be lost (e.g., invalid) if supply power (e.g., supply voltage Vcc) is disconnected from memory device 100. Hereinafter, supply voltage Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

In a physical structure of memory device 100, each of memory cells 102 can include transistors (e.g., two transistors) formed vertically (e.g., stacked on different layers) in different levels over a substrate (e.g., semiconductor substrate) of memory device 100. Memory device 100 can also include multiple levels (e.g., multiple decks) of memory cells where one level (e.g., one deck) of memory cells can be formed over (e.g., stacked on) another level (e.g., another deck) of additional memory cells. The structure of memory array 101, including memory cells 102, can include the structure of memory arrays and memory cells described below with reference to FIG. 2 through FIG. 29C.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines (e.g., address lines) 107. Memory device 100 can include row access circuitry (e.g., X-decoder) 108 and column access circuitry (e.g., Y-decoder) 109 that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or identical to any of the memory devices described below with reference to FIG. 2 through FIG. 29C.

Figure 2:
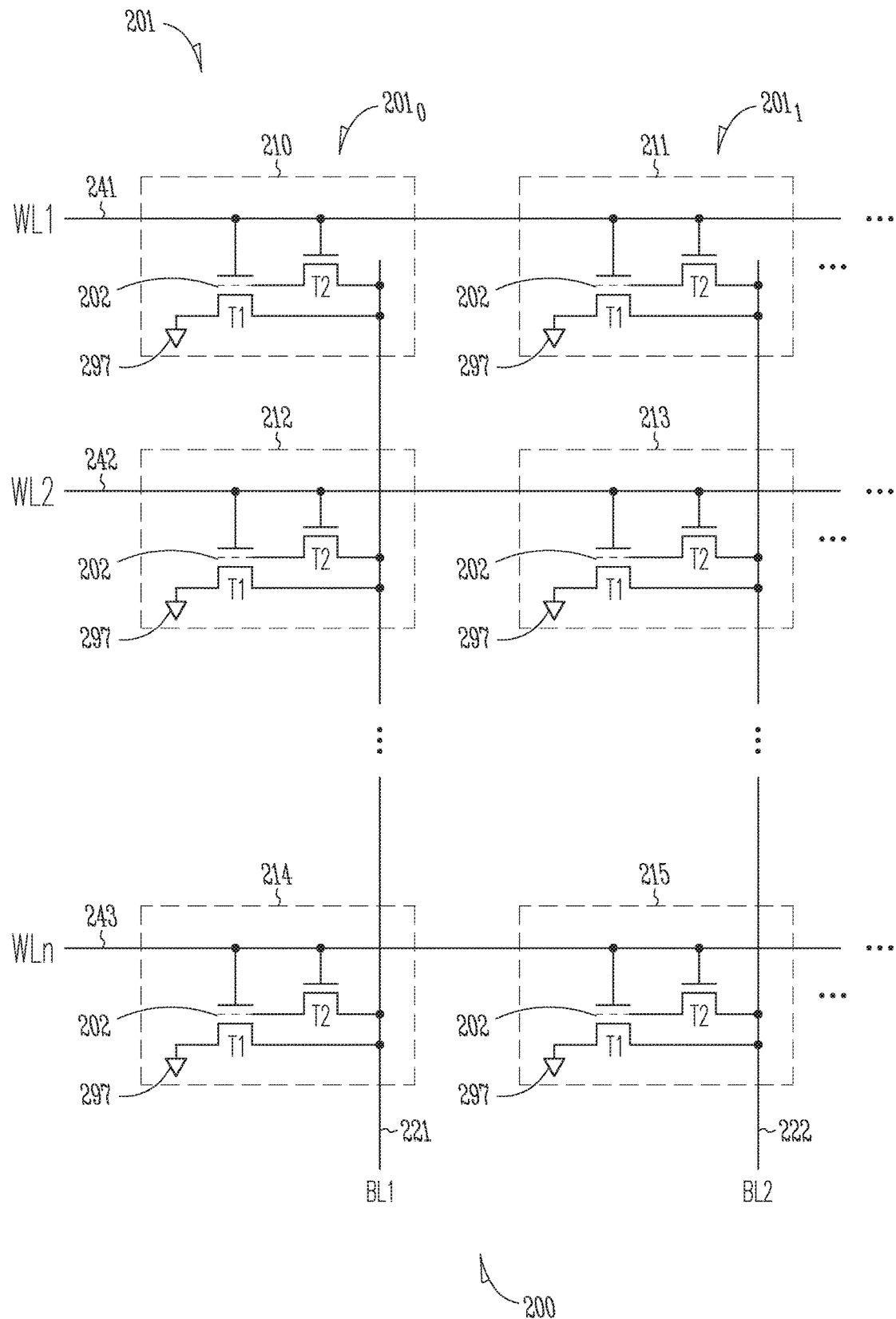
FIG. 2 shows a schematic diagram of a portion of a memory device including a memory array of two-transistor (2T) memory cells, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Each of memory cells 210 through 215 can include two transistors T1 and T2. Thus, each of memory cells 210 through 215 can be called a 2T memory cell (e.g., 2T gain cell). Each of transistors T1 and T2 can include a field-effect transistor (FET). As an example, transistor T1 can be a p-channel FET (PFET), and transistor T2 can be an n-channel FET (NFET). Part of transistor T1 can include a structure of a p-channel metal-oxide semiconductor (PMOS) transistor FET (PFET). Thus, transistor T1 can include an operation similar to that of a PMOS transistor. Part of transistor 2 can include an n-channel metal-oxide semiconductor (NMOS). Thus, transistor 2 can include an operation similar to that of a NMOS transistor.

Transistor T1 of memory device 200 can include a charge-storage based structure (e.g., a floating-gate based). As shown in FIG. 2, each of memory cells 210 through 215 can include a charge storage structure 202, which can include the floating gate of transistor T1. Charge storage structure 202 can form the memory element of a respective memory cell among memory cells 210 through 215. Charge storage structure 202 can store charge. The value (e.g., "0" or "1") of information stored in a particular memory cell among memory cells 210 through 215 can be based on the amount of charge in charge storage structure 202 of that particular memory cell.

As shown in FIG. 2, transistor T2 (e.g., the channel region of transistor T2) of a particular memory cell among memory cells 210 through 215 can be electrically coupled to (e.g., directly coupled to) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200.

Memory cells 210 through 215 can be arranged in memory cell groups $201_0$ and $201_1$. FIG. 2 shows two memory cell groups (e.g., $201_0$ and $201_1$) as an example. However, memory device 200 can include more than two memory cell groups. Memory cell groups $201_0$ and $201_1$ can include the same number of memory cells. For example, memory cell group $201_0$ can include memory cells 210, 212, and 214, and memory cell group $201_1$ can include memory cells 211, 213, and 215. FIG. 2 shows three memory cells in each of memory cell groups $201_0$ and $201_1$ as an example. The number of memory cells in memory cell groups $201_0$ and $201_1$ can be different from three.

Memory device 200 can perform a write operation to store information in memory cells 210 through 215, and a read operation to read (e.g., sense) information from memory cells 210 through 215. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate of transistor T1. During an operation (e.g., a read or write operation) of memory device 200, an access line (e.g., a single access line) and a data line (e.g., a single data line) can be used to access a selected memory cell (e.g., target memory cell).

As shown in FIG. 2, memory device 200 can include access lines (e.g., word lines) 241, 242, and 243 that can carry respective signals (e.g., word line signals) WL1, WL2, and WLn. Access lines 241, 242, and 243 can be used to access both memory cell groups $201_0$ and $201_1$. Each of access lines 241, 242, and 243 can be structured as at least one conductive line (one conductive line or multiple conductive lines that can be electrically coupled (e.g., shorted) to each other). Access lines 241, 242, and 243 can be selectively activated (e.g., activated one at a time) during an operation (e.g., read or write operation) of memory device 200 to access a selected memory cell (or selected memory cells) among memory cells 210 through 215. A selected cell can be referred to as a target cell. In a read operation, information can be read from a selected memory cell (or selected memory cells). In a write operation, information can be stored in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Some conventional memory devices may use multiple (e.g., two separate) access lines to control access to a respective memory cell during read and write operations. In comparison with such conventional memory devices (that use multiple access lines for the same memory cell), memory device 200 uses a single access line (e.g., shared access line) in memory device 200 to control both transistors T1 and T2 of a respective memory cell to access the respective memory cell. This technique can save space and simplify operation of memory device 200. Further, some conventional memory devices may use multiple data lines to access a selected memory cell (e.g., during a read operation) to read information from the selected memory cell. In memory device 200, a single data line (e.g., data line 221 or 222) can be used to access a selected memory cell (e.g., during a read operation) to read information from the selected memory cell. This may also simplify the structure, operation, or both of memory device 200 in comparison with conventional memory devices that use multiple data lines to access a selected memory cell.

In memory device 200, the gate of each of transistors T1 and T2 can be part of a respective access line (e.g., a respective word line). As shown in FIG. 2, the gate of each of transistors T1 and T2 of memory cell 210 can be part of access line 241. The gate of each of transistors T1 and T2 of memory cell 211 can be part of access line 241. For example, in the structure of memory device 200, four different portions of a conductive material (or materials) that form access line 241 can form the gates (e.g., four gates) of transistors T1 and T2 of memory cell 210 and the gates of transistors T1 and T2 of memory cell 211, respectively.

The gate of each of transistors T1 and T2 of memory cell 212 can be part of access line 242. The gate of each of transistors T1 and T2 of memory cells 213 can be part of access line 242. For example, in the structure of memory device 200, four different portions of a conductive material (or materials) that form access line 242 can form the gates (e.g., four gates) of transistors T1 and T2 of memory cell 212 and the gates of transistors T1 and T2 of memory cell 213, respectively.

The gate of each of transistors T1 and T2 of memory cell 214 can be part of access line 243. The gate of each of transistors T1 and T2 of memory cell 215 can be part of access line 243. For example, in the structure of memory device 200, four different portions of a conductive material (or materials) that form access line 243 can form the gates (e.g., four gates) of transistors T1 and T2 of memory cell 214 and the gates of transistors T1 and T2 of memory cell 215, respectively.

Memory device 200 can include data lines (e.g., bit lines) 221 and 222 that can carry respective signals (e.g., bit line signals) BL1 and BL2. During a read operation, memory device 200 can use data line 221 to obtain information read (e.g., sensed) from a selected memory cell of memory cell group $201_0$, and data line 222 to read information from a selected memory cell of memory cell group $201_1$. During a write operation, memory device 200 can use data line 221 to provide information to be stored in a selected memory cell of memory cell group $201_0$, and data line 222 to provide information to be stored in a selected memory cell of memory cell group $201_1$.

Memory device 200 can include a ground connection (e.g., ground plate) 297 coupled to each of memory cells 210 through 215. Ground connection 297 can be structured from a conductive plate (e.g., a layer of conductive material) that can be coupled to a ground terminal of memory device 200. As an example, ground connection 297 can be a common plate (e.g., formed under the memory cells (e.g., memory cells 210 through 215)) of memory device 200. In this example, the elements (e.g., transistors T1 and T2) of each of the memory cells (e.g., memory cells 210 through 215) of memory device 200 can be formed over (e.g., formed vertically) the common plate.

As shown in FIG. 2, transistor T1 (e.g., the channel region of transistor T1) of a particular memory cell among memory cells 210 through 215 can be electrically coupled to (e.g., directly coupled to) ground connection 297 and electrically coupled to (e.g., directly coupled to) a respective data line (e.g., data line 221 or 222). Thus, a circuit path (e.g., current path) can be formed between a respective data line (e.g., data line 221 or 222) and ground connection 297 through transistor T1 of a selected memory cell during an operation (e.g., a read operation) performed on the selected memory cell.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., memory cell 210, 212, or 214) can include a current path (e.g., read current path) through a channel region of transistor T1 of that particular memory cell, data line 221, and ground connection 297. In memory cell group $201_1$, a read path of a particular memory cell (e.g., memory cell 211, 213, or 215)

can include a current path (e.g., read current path) through a channel region of transistor T1 of that particular memory cell, data line 222, and ground connection 297. In the example where transistor T1 is a PFET (e.g., a PMOS), the current in the read path (e.g., during a read operation) can include a hole conduction (e.g., hole conduction in the direction from data line 221 to ground connection 297 through the channel region of transistor T1). Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include transistor T2 (e.g., can include a write current path through a channel region of transistor T2) of that particular memory cell and data line 221. In memory cell group $201_1$, a write path of a particular memory cell (e.g., memory cell 211, 213, or 215) can include transistor T2 (e.g., can include a write current path through a channel region of transistor T2) of that particular memory cell and data line 222. In the example where transistor T2 is an NFET (e.g., NMOS), the current in a write path (e.g., during a write operation) can include an electron conduction (e.g., electron conduction in the direction from data line 221 to charge storage structure 202) through the channel region of transistor T2. Since transistor T2 can be used in a write path to store information in a respective memory cell during a write operation, transistor T2 can be called a write transistor and the channel region of transistor T1 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 in transistor T1 on the read path during a read operation without affecting (e.g., without turning on) transistor T2 on the write path (e.g., path through transistor T2). This can prevent leaking of charge (e.g., during a read operation) from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0V) regardless of the value (e.g., "0" or "1") of information stored in charge storage structure 202 of transistor T1, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be expressed as follows: Vt1 for state "0"<Vt1 for state "1"<0V, and Vt2=0V (or alternatively Vt2>0V).

In an alternative structure of memory device 200, transistors T1 and T2 can be formed (e.g., engineered) such that Vt1 for state "0"<Vt1 for state "1", where Vt1 for state "0"<0V (or alternatively Vt1 for state "0"=0V), Vt1 for state "1">0V, and Vt1<Vt2.

In another alternative structure, transistors T1 and T2 can be formed (e.g., engineered) such that Vt1 (for state "0")<Vt1 (for state "1"), where Vt1 for state "0"=0V (or alternatively Vt1 for state "0">0V), and Vt1<Vt2.

During a read operation of memory device 200, only one memory cell of the same memory cell group can be selected at a time to read information from the selected memory cell. For example, memory cells 210, 212, and 214 of memory cell group $201_0$ can be selected one at a time during a read operation to read information from the selected memory cell (e.g., one of memory cells 210, 212, and 214 in this example). In another example, memory cells 211, 213, and 215 of memory cell group $201_1$ can be selected one at a time during a read operation to read information from the selected memory cell (e.g., one of memory cells 211, 213, and 215 in this example).

During a read operation, memory cells of different memory cell groups (e.g., memory cell groups $201_0$ and $201_1$) that share the same access line (e.g., access line 241, 242, or 243) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $201_0$ during a read operation can be determined based on the value of a current detected (e.g., sensed) from a read path (described above) that includes data line 221, transistor T1 of the selected memory cell (e.g., memory cell 210, 212, or 214), and ground connection 297. The value of information read from the selected memory cell of memory cell group $201_1$ during a read operation can be determined based on the value of a current detected (e.g., sensed) from a read path that includes data line 222, transistor T1 of the selected memory cell (e.g., memory cell 211, 213, or 215), and ground connection 297.

Memory device 200 can include detection circuitry (not shown) that can operate during a read operation to detect (e.g., sense) a current (e.g., current I1, not shown) on a read path that includes data line 221, and detect a current (e.g., current I2, not shown) on a read path that includes data line 222. The value of the detected current can be based on the value of information stored in the selected memory cell. For example, depending on the value of information stored in the selected memory cell of memory cell group $201_0$, the value of the detected current (e.g., the value of current I1) on data line 221 can be zero or greater than zero. Similarly, depending on the value of information stored in the selected memory cell of memory cell group $201_1$, the value of the detected current (e.g., the value of current I2) between data line 222 can be zero or greater than zero. Memory device 200 can include circuitry (not shown) to translate the value of a detected current into the value (e.g., "0", "1", or a combination of multi-bit values) of information stored in the selected memory cell.

During a write operation of memory device 200, only one memory cell of the same memory cell group can be selected at a time to store information in the selected memory cell. For example, memory cells 210, 212, and 214 of memory cell group $201_0$ can be selected one at a time during a write operation to store information in the selected memory cell (e.g., one of memory cell 210, 212, and 214 in this example).

In another example, memory cells 211, 213, and 215 of memory cell group 201$_1$ can be selected one at a time during a write operation to store information in the selected memory cell (e.g., one of memory cell 211, 213, and 215 in this example).

During a write operation, memory cells of different memory cell groups (e.g., memory cell groups 201$_0$ and 201$_1$) that share the same access line (e.g., access line 241, 242, or 243) can be concurrently selected. For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group 201$_0$ during a write operation can be provided through a write path (described above) that includes data line 221 and transistor T2 of the selected memory cell (e.g., memory cell 210, 212, or 214). Information to be stored in a selected memory cell of memory cell group 201$_1$ during a write operation can be provided through a write path (described above) that includes data line 222 and transistor T2 of the selected memory cell (e.g., memory cell 211, 213, or 215). As described above, the value (e.g., binary value) of information stored in a particular memory cell among memory cells 210 through 215 can be based on the amount of charge in charge storage structure 202 of that particular memory cell.

In a write operation, the amount of charge in charge storage structure 202 of a selected memory cell can be changed (to reflect the value of information stored in the selected memory cell) by applying a voltage on a write path that includes transistor T2 of that particular memory cell and the data line (e.g., data line 221 or 222) coupled to that particular memory cell. For example, a voltage having one value (e.g., 0V) can be applied on data line 221 (e.g., provide 0V to signal BL) if information to be stored in a selected memory cell among memory cells 210, 212, and 214 has one value (e.g., "0"). In another example, a voltage having another value (e.g., a positive voltage) can be applied on data line 221 (e.g., provide a positive voltage to signal BL1) if information to be stored in a selected memory cell among memory cells 210, 212, and 214 has another value (e.g., "1"). Thus, information can be stored (e.g., directly stored) in charge storage structure 202 of a particular memory cell by providing the information to be stored (e.g., in the form of a voltage) on a write path (that includes transistor T2) of that particular memory cell.

Figure 3:
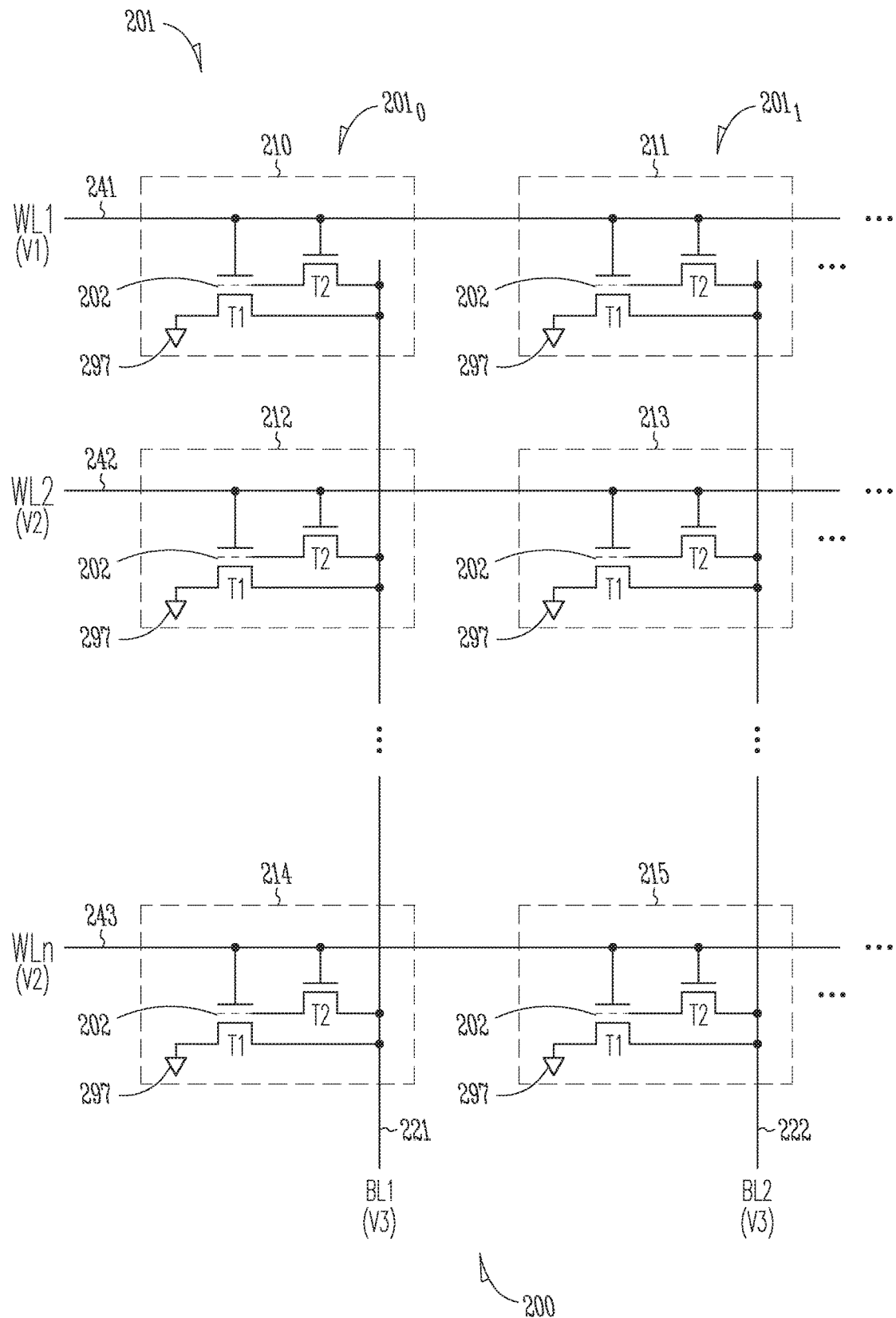
FIG. 3 shows the memory device of FIG. 2, including example voltages used during a read operation of the memory device, according to some embodiments described herein.

FIG. 3 shows memory device 200 of FIG. 2 including example voltages V1, V2, and V3 used during a read operation of memory device 200, according to some embodiments described herein. The example of FIG. 3 assumes that memory cells 210 and 211 are selected memory cells (e.g., target memory cells) during a read operation to read (e.g., to sense) information stored (e.g., previously stored) in memory cells 210 and 211. Memory cells 212 through 215 are assumed to be unselected memory cells. This means that memory cells 212 through 215 are not accessed, and information stored in memory cells 212 through 215 is not read while information is read from memory cells 210 and 211 in the example of FIG. 3.

In FIG. 3, voltages V1, V2, and V3 can represent different voltages applied to respective access lines 241, 242, and 243 and data lines 221 and 222 during a read operation of memory device 200. As an example, voltages V1, V2, and V3 can have values −1V, 0V, and 0.5V, respectively. The specific values of voltages used in this description are only example values. Different values may be used. For example, voltage V1 can have a negative value range (e.g., the value of voltage V1 can be from −3V to −1V).

In the read operation shown in FIG. 3, voltage V1 can have a value (voltage value) to turn on transistor T1 of each of memory cells 210 and 211 (selected memory cells in this example) and turn off (or keep off) transistor T2 of each of memory cells 210 and 211. This allows information to be read from memory cells 210 and 211. Voltage V2 can have a value, such that transistors T1 and T2 of each of memory cells 212 through 215 (unselected memory cells in this example) are turned off (e.g., kept off). Voltage V3 can have a value, such that a current (e.g., read current) may be formed on a read path that includes data line 221 and transistor T1 of memory cell 210, and a read path (a separate read path) that includes data line 222 and transistor T1 of memory cell 212. This allows a detection of current on the read paths coupled to memory cells 210 and 211, respectively. A detection circuitry (not shown) of memory device 200 can operate to translate the value of the detected current (during reading of information from the selected memory cells) into the value (e.g., "0", "1", or a combination of multi-bit values) of information read from the selected memory cell. In the example of FIG. 3, the value of the detected currents on data lines 221 and 222 can be translated into the values of information read from memory cells 210 and 211, respectively.

In the read operation shown in FIG. 3, the voltages applied to respective access lines 241, 242, and 243 can cause transistors T1 and T2 of each of memory cells 212 through 215, except transistor T1 of each of memory cells 210 and 211 (selected memory cells), to turn off (or to remain turned off). Transistor T1 of memory cell 210 (selected memory cell) may or may not turn on, depending on the value of the threshold voltage Vt1 of transistor T1 of memory cell 210. Transistor T1 of memory cell 211 (selected memory cell) may or may not turn on, depending on the value of the threshold voltage Vt1 of transistor T1 of memory cell 211. For example, if transistor T1 of each of memory cells (e.g., 210 through 215) of memory device 200 is configured (e.g., structured) such that the threshold voltage of transistor T1 is less than zero (e.g., Vt1<−1V) regardless of the value (e.g., the state) of information stored in a respective memory cell 210, then transistor T1 of memory cell 210, in this example, can turn on and conduct a current on data line 221 (through transistor T1 of memory cell 210). In this example, transistor T1 of memory cell 211 can also turn on and conduct a current on data line 222 (through transistor T1 of memory cell 211). Memory device 200 can determine the value of information stored in memory cells 210 and 211 based on the value of the currents on data lines 221 and 222, respectively. As described above, memory device 200 can include detection circuitry to measure the value of currents on data lines 221 and 222 during a read operation.

Figure 4:
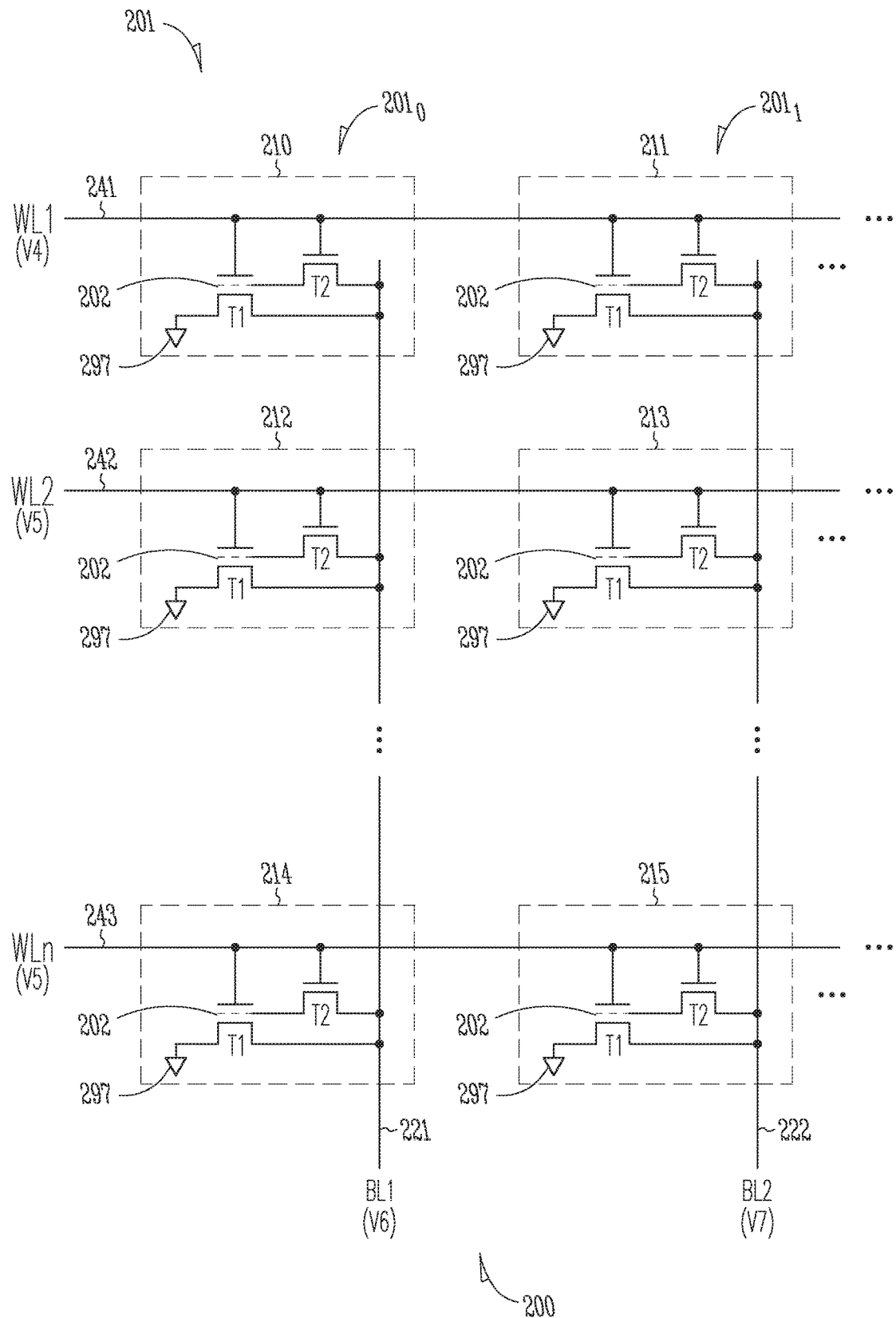
FIG. 4 shows the memory device of FIG. 2, including example voltages used during a write operation of the memory device, according to some embodiments described herein.

FIG. 4 shows memory device 200 of FIG. 2 including example voltages V4, V5, V6, and V7 used during a write operation of memory device 200, according to some embodiments described herein. The example of FIG. 4 assumes that memory cells 210 and 211 are selected memory cells (e.g., target memory cells) during a write operation to store information in memory cells 210 and 211. Memory cells 212 through 215 are assumed to be unselected memory cells. This means that memory cells 212 through 215 are not accessed and information is not to be stored in memory cells 212 through 215 while information is stored in memory cells 210 and 211 in the example of FIG. 4.

In FIG. 4, voltages V4, V5, V6, and V7 can represent different voltages applied to respective access lines 241, 242, and 243 and data lines 221 and 222 during a write operation of memory device 200. As an example, voltages V4 and V5 can have values of 3V and 0V, respectively. These values are example values. Different values may be used.

The values of voltages V6 and V7 can be the same or different depending on the value (e.g., "0" or "1") of information to be stored in memory cells 210 and 211. For example, the values of voltages V6 and V7 can be the same (e.g., V6=V7) if the memory cells 210 and 211 are to store information having the same value. As an example, V6=V7=0V if information to be stored in each memory cell 210 and 211 is "0", and V6=V7=1V to 3V if information to be stored in each memory cell 210 and 211 is "1".

In another example, the values of voltages V6 and V7 can be different (e.g., V6≠V7) if the memory cells 210 and 211 are to store information having different values. As an example, V6=0V and V7=1V to 3V if "0" is to be stored in memory cell 210 and "1" is to be stored in memory cell 211. As another example, V6=1V to 3V and V7=0V if "1" is to be stored in memory cell 210 and "0" is to be stored in memory cell 211.

The range of voltage of 1V to 3V is used here as an example. A different range of voltages can be used. Further, instead of applying 0V (e.g., V6=0V or V7=0V) to a particular write data line (e.g., data line 221 or 222) for storing information having a value of "0" to the memory cell (e.g., memory cell 210 or 211) coupled to that particular write data line, a positive voltage (e.g., V6>0V or V7>0V) may be applied to that particular data line.

In a write operation of memory device 200 of FIG. 4, voltage V5 can have a value, such that transistors T1 and T2 of each of memory cells 212 through 215 (unselected memory cells, in this example) are turned off (e.g., kept off). Voltage V4 can have a value to turn on transistor T2 of each of memory cells 210 and 211 (selected memory cells in this example) and form a write path between charge storage structure 202 of memory cell 210 and data line 221, and a write path between charge storage structure 202 of memory cell 211 and data line 222. A current (e.g., write current) may be formed between charge storage structure 202 of memory cell 210 (selected memory cell) and data line 221. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 (selected memory cell) and data line 222. This current can affect (e.g., change) the amount of charge on charge storage structure 202 of memory cell 211 to reflect the value of information to be stored in memory cell 211.

In the example write operation of FIG. 4, the value of voltage V6 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V7 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

FIG. 5, FIG. 6, FIG. 7, FIG. 8A, and FIG. 8B show different views of a structure of memory device 200 of FIG. 2 with respect to the X, Y, and Z directions, according to some embodiments described herein. For simplicity, cross-sectional lines (e.g., hatch lines) are omitted from most of the elements shown in FIG. 5 through FIG. 8B and other figures (e.g., FIG. 9 through FIG. 29C) in the drawings described herein. Some elements of memory device 200 (and other memory devices described herein) may be omitted from a particular figure of the drawings so as to not obscure the description of the element (or elements) being described in that particular figure. The dimensions (e.g., physical structures) of the elements shown in the drawings described herein are not scaled.

FIG. 5 and FIG. 6 show different 3-dimensional views (e.g., isometric views) of memory device 200 with respect to the X-Y, and Z directions. FIG. 7 shows a side view (e.g., cross-sectional view) of memory device 200 with respect to the X-Z direction. FIG. 8A shows a view (e.g., cross-sectional view) taken along lines 8A-8A of FIG. 7. FIG. 8B shows a top view (e.g., plan view) of a portion of memory device 200 of FIG. 7 7. FIG. 8B omits the structures of memory cells 214 and 215 and associated access lines 243 of FIG. 2. However, FIG. 8B shows the structures of memory cells 210', 211', 212', and 213' and associated data lines 223 and 224 (memory cells 210', 211', 212', and 213' and associated data lines 223 and 224 are not schematically shown in FIG. 2).

For simplicity, FIG. 5 and FIG. 6 show the structure of memory cell 210. The structures of other memory cells (e.g., memory cells 211 through 215) of memory device 200 of FIG. 2 can be similar to or identical to the structure of memory cell 210 shown in FIG. 5 and FIG. 6. In FIG. 2 and FIG. 5 through FIG. 8B, the same elements are given the same reference numbers. Some portions (e.g., gate oxide and cell isolation structures) of memory device 200 are omitted from FIG. 5 and FIG. 6 so as to not obscure the structure the elements being shown in FIG. 5 and FIG. 6.

The following description refers to FIG. 5 through FIG. 8B. For simplicity, detailed description of the same element is not repeated in the description of FIG. 5 through FIG. 8B.

As shown in FIG. 5, memory device 200 can include a substrate 599 over which memory cell 210 (and other memory cells (not shown) of memory device 200) can be formed. Transistors T1 and T2 of memory cell 210 can be formed vertically with respect to substrate 599. Substrate 599 can be a semiconductor substrate (e.g., silicon-based substrate) or other type of substrate. The Z-direction (e.g., vertical direction) is a direction perpendicular to (e.g., outward from) substrate 599. The Z-direction is also perpendicular to (e.g., extended vertically from) an X-direction and a Y-direction. The X-direction and Y-direction are perpendicular to each other.

As shown in FIG. 5 through FIG. 8A, ground connection 297 can include a structure (e.g., a piece (e.g., a layer)) of conductive material (e.g., conductive region) located over substrate 599. Example materials for ground connection 297 include a piece of metal, conductively doped polysilicon, or other conductive materials. Ground connection 297 can be coupled to a ground terminal (not shown) of memory device 200.

FIG. 5 through FIG. 8B show ground connection 297 contacting (e.g., directly coupled to) substrate 599 as an example. In an alternative structure, memory device 200 can include a dielectric (e.g., a layer of dielectric material, not shown) between ground connection 297 and substrate 599.

As shown in FIG. 5 through FIG. 8B, memory device 200 can include a semiconductor material 596 formed over ground connection 297. In FIG. 8B, ground connection 297 and substrate 599 (not labeled) are underneath semiconductor material 596 (and are hidden from the view of FIG. 8B). Semiconductor material 596 can include a structure (e.g., a piece (e.g., a layer)) of silicon, polysilicon, or other semiconductor material, and can include a doped region (e.g., p-type doped region), or other conductive materials.

As shown in FIG. 5 through FIG. 8B, each of data lines 221, 222, 223, and 224 (associated with signals BL1, BL2, BL3, and BL4, respectively) can have a length in the Y-direction, a width in the X-direction, and a thickness in the Z-direction. Each of data lines 221, 222, 223, and 224 can include a conductive material (or a combination of materials) that can be structured as a conductive line (e.g., conductive region). Example materials for data lines 221 and 222 include metal, conductively doped polysilicon, or other conductive materials.

Access line 241 (associated with signal WL1) can be structured by (can include) a combination of portions 541F and 541B (e.g., front and back conductive portions with respect to the Y-direction). Each of portions 541F and 541B can include a conductive material (or a combination of materials) that can be structured as a conductive line (e.g., conductive region) having a length extending continuously in the X-direction. Thus, portions 541F and 541B can be part of conductive lines that are opposite from each other (e.g., opposite from each other in the Y-direction).

Each of portions 541F and 541B can include structure (e.g., a piece (e.g., a layer)) of conductive material (e.g., metal, conductively doped polysilicon, or other conductive materials). Each of portions 541F and 541B can have a length (shown in FIG. 5) in the X-direction, a width (shown in FIG. 5) in the Z-direction, and a thickness (shown in FIG. 8A) in the Y-direction.

Portions 541F and 541B can be electrically coupled to each other. For example, memory device 200 can include a conductive material (e.g., not shown) that can contact (e.g., electrically couple to) portions 541F and 541B, such that portions 541F and 541B (which are part of a single access line 241) can be concurrently applied by the same signal (e.g., signal WL1).

FIG. 8B also shows access line 242 (associated with signal WL2) that can include a structure (and materials) similar to (or the same as) that of access line 241. For example, access line 242 can be structured by (can include) a combination of portions 542F and 542B (e.g., front and back conductive portions with respect to the Y-direction). Portions 542F and 542B can be electrically coupled to each other (e.g., coupled to each other by a conductive material (e.g., not shown)), such that portion 542F and can be concurrently applied by the same signal (e.g., signal WL2).

In an alternative structure of memory device 200, one of the two portions of each of the access lines of memory device 200 can be omitted. For example, either portions 541F and 542F or portions 541B and 542B can be omitted, such that access line 241 can include only either portion 541F or portion 541B, and access line 242 can include only either portion 542F or portion 542B. In the structure shown in FIG. 5 through FIG. 8B, including two portions (e.g., portions 541F and 541B, and portions 542F and 542B) in each access line and can help better control transistor T1 (e.g., transistor T1, shown schematically in FIG. 2) of each of the memory cells (e.g., memory cells 210, 211, 212, 213, 210', 211', 212', and 213' in FIG. 8B) of memory device 200 during a read operation.

Charge storage structure 202 (FIG. 5 through FIG. 8B) can include a charge storage material (or a combination of materials), which can include a piece (e.g., a layer) of semiconductor material (e.g., polysilicon), a piece (e.g., a layer) of metal, or a piece of material (or materials) that can trap charge. The materials for charge storage structure 202 and the portions (e.g., portions 541F and 541B, and portions 542F and 542B) of the access lines (e.g., access lines 241 and 242) can be the same or can be different. As shown in FIG. 5, charge storage structure 202 can include a portion (e.g., bottom portion) that is closer (e.g., extends in the Z-direction closer) to substrate 599 than each of portions 541F and 541B of access line 241.

FIG. 5 through FIG. 8A show an example where the top edge of charge storage structure 202 is at a specific distance (e.g., distance shown in FIG. 5) from the edge (e.g., bottom edge) of each of portions 541F and 541B of access line 241. However, the distance between the top edge of charge storage structure 202 and the edge (e.g., bottom edge) of each of portions 541F and 541B may vary.

FIG. 5 through FIG. 8A show an example where portions 541F and 541B overlap (in the Z-direction) charge storage structure 202. However, portions 541F and 541B may not overlap charge storage structure 202.

Memory device 200 can include material 520 located between data line 221 and charge storage structure 202. As shown in FIG. 5, material 520 can be electrically coupled to data line 221 and charge storage structure 202 of memory cell 210. As described above, charge storage structure 202 of memory cell 210 can form the memory element of memory cell 210. Thus, memory cell 210 can include a memory element (which is charge storage structure 202) located between substrate 599 and material 520 with respect to the Z-direction, and the memory element contacts (e.g., directly coupled to) material 520.

Material 520 can form a source (e.g., source terminal), a drain (e.g., drain terminal), a channel region (e.g., write channel region) between the source and the drain of transistor T2 of memory cell 210. Thus, as shown in FIG. 5, the source, channel region, and the drain of transistor T2 of memory cell 210 can be formed from a single piece of the same material (or alternatively, a single piece of the same combination of materials), such as material 520. Therefore, the source, the drain, and the channel region of transistor T2 of memory cell 210 can be formed from the same material (e.g., material 520) of the same conductivity type (e.g., either n-type or p-type).

As shown in FIG. 7, memory device 200 can include material 521 that can form a source (e.g., source terminal), a drain (e.g., drain terminal), and a channel region (e.g., write channel region) between the source and the drain of transistor T2 of memory cell 211. Thus, as shown in FIG. 5, the source, channel region, and the drain of transistor T2 of memory cell 211 can be formed from a single piece of the same material (or alternatively, a single piece of the same combination of materials) such as material 521.

Materials 520 and 521 can be the same. For example, each of materials 520 and 521 can include a structure (e.g., a piece (e.g., a layer)) of semiconductor material. In the example where transistor T2 is an NFET (as described above), materials 520 and 521 can include n-type semiconductor material (e.g., n-type silicon).

In another example, the semiconductor material that forms material 520 or material 521 can include a piece of oxide material. Examples of the oxide material used for materials 520 and 521 include semiconducting oxide materials, transparent conductive oxide materials, and other oxide materials.

As an example, each of materials 520 and 521 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Sn_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the materials listed above in memory device 200 provides improvement and benefits for memory device 200. For example, during a read operation, to read information from a selected memory cell (e.g., memory cell 210 or 211), charge from charge storage structure 202 of the selected memory cell may leak to transistor T2 of the selected memory cell. Using the material listed above for the channel region (e.g., material 520 or 521) of transistor T2 can reduce or prevent such a leakage. This improves the accuracy of information read from the selected memory cell and improves the retention of information stored in the memory cells of the memory device (e.g., memory device 200) described herein.

The materials listed above are examples of materials 520 and 521. However, other materials (e.g., a relatively high band-gap material) different from the above-listed materials can be used.

In FIG. 5, material 520 and charge storage structure 202 of memory cell 210 can be electrically coupled (e.g., directly coupled) to each other, such that material 520 can contact charge storage structure 202 of memory cell 210 without an intermediate material (e.g., without a conductive material) between charge storage structure 202 of memory cell 210 and material 520. In another example, material 520 can be electrically coupled to charge storage structure 202 of memory cell 210, such that material 520 is not directly coupled to (not contacting) charge storage structure 202 of memory cell 210, but material 520 is coupled to (e.g., indirectly contacting) charge storage structure 202 of memory cell 210 through an intermediate material (e.g., a conductive material, not shown in FIG. 5) between charge storage structure 202 of memory cell 210 and material 520.

As shown in FIG. 5, memory cell 210 can include portions 510A and 510B electrically coupled to each other. Each of portions 510A and 510B can include a structure (e.g., a piece (e.g., a layer)) of semiconductor material. Example materials for each of portions 510A and 510B include silicon, polysilicon (e.g., undoped or doped polysilicon), germanium, silicon-germanium, or other semiconductor materials, and semiconducting oxide materials (oxide semiconductors, e.g., SnO or other oxide semiconductors).

As described above with reference to FIG. 2, transistor T1 of memory cell 210 includes a channel region (e.g., read channel region). In FIG. 5, the channel region of transistor T1 of memory cell 210 can include (e.g., can be formed from a combination of) portions 510A and 510B. Portions 510A and 510B can be electrically coupled to data line 221. As described above with reference to FIG. 2, memory cell 210 can include a read path. In FIG. 5, portions 510A and 510B (e.g., the read channel region of transistor T1 of memory cell 210) can be part of the read path of memory cell 210 that can carry a current (e.g., read current) during a read operation of reading information from memory cell 210. For example, during a read operation, to read information from memory cell 210, portions 510A and 510B can conduct a current (e.g., read current) between data line 221 and ground connection 297 (through part of semiconductor material 596). The direction of the read current can be from data line 221 to ground connection 297 (through portions 510A, part of portion 510B, and part of semiconductor material 596). In the example where transistor T1 is a PFET and transistor T2 is an NFET, the material that forms portions 510A and 510B can have a different conductivity type from material 520 or 521. For example, portions 510A and 510B can include p-type semiconductor material (e.g., p-type silicon) regions, and materials 520 and 521 can include n-type semiconductor material (e.g., n-type gallium phosphide (GaP)) regions.

As shown in FIG. 5, FIG. 6, and FIG. 7, memory cell 210 can include dielectrics 515A and 515B. Dielectrics 515A and 515B can be gate oxide regions that electrically separate charge storage structure 202 from portions 510A and 510B, and electrically separate material 520 from portion 510A. Example materials for dielectrics 515A and 515B include silicon dioxide, hafnium oxide (e.g., $HfO_2$), aluminum oxide (e.g., $Al_2O_3$), or other dielectric materials. In an example structure of memory device 200, dielectrics 515A and 515B include a high-k dielectric material (e.g., a dielectric material having a dielectric constant greater than the dielectric constant of silicon dioxide). Using such a high-k dielectric material (instead of silicon dioxide) can improve the performance (e.g., reduce current leakage, increase drive capability of transistor T1, or both) of memory device 200.

As shown in FIG. 8B, the memory cells (e.g., memory cells 210, 211, 212, 213, 210', 211', 212', and 213' in FIG. 8B) of memory device 200 can share (e.g., can electrically couple to) semiconductor material 596. For example, the read channel regions of the memory cells (e.g., portions 510A and 510B of memory cell 210 and portions 511A and 511B of memory cell 211 in FIG. 7) of memory device 200 can contact (e.g., can be electrically coupled to) semiconductor material 596.

As shown in FIG. 5 through FIG. 8B, memory device 200 can include a conductive region 597 (e.g., a common conductive plate) under the memory cells (e.g., memory cells 210, 211, 212, 213, 210', 211', 212', and 213' in FIG. 8B) of memory device 200. Conductive region 597 can include at least one of the materials (e.g., doped polysilicon) of semiconductor material 596 and the material (e.g., metal or doped polysilicon) of ground connection 297. For example, conductive region 597 can include the material of semiconductor material 596, the material of ground connection 297, or the combination of the materials of semiconductor material 596 and ground connection 297. Thus, as shown FIG. 8B, the memory cells (e.g., memory cells 210, 211, 212, 213, 210', 211', 212', and 213' in FIG. 8B) of memory device 200 can share conductive region 597 (which can include any combination of semiconductor material 596 and ground connection 297).

As shown in FIG. 7, memory device 200 can include a conductive structure 503 located between charge storage structure 202 of memory cell 210 and charge storage structure 202 of memory cell 210. Memory device 200 can include dielectrics (e.g., silicon dioxide) 545A and 545B to electrically separate (e.g., isolate) conductive structure 503 from charge storage structure 202 of memory cell 210 and charge storage structure 202 of memory cell 210.

Conductive structure 503 can be a shield (e.g., a capacitive coupling isolation structure) between adjacent charge storage structures of adjacent memory cells. For example, conductive structure 503 between memory cells 210 and 211 (adjacent memory cells) can be a shield between charge storage structures 202 of memory cells 210 and 211. Conductive structure 503 between memory cells 212 and 213 (adjacent memory cells) can be a shield between charge storage structures 202 of memory cells 212 and 213. Conductive structure 503 between memory cells 210' and 211' (adjacent memory cells) can be a shield between charge storage structures 202 of memory cells 210' and 211'. Conductive structure 503 between memory cells 212' and 213' (adjacent memory cells) can be a shield between charge storage structures 202 of memory cells 212' and 213'.

Including conductive structure 503 (e.g., a capacitive coupling isolation structure) between adjacent charge storage structures (e.g., charge storage structures 202) of adjacent memory cells of memory device 200 can reduce capacitive coupling between adjacent charge storage structures of adjacent memory cells. A reduction in capacitive coupling between adjacent charge storage structures can improve operation (e.g., improve read signal margin) of memory device 200.

Conductive structure 503 can include metal, polysilicon (e.g., conductively doped polysilicon), or other conductive material (or a combination of conductive materials). The conductively doped polysilicon used for conductive structure 503 can be either polysilicon of n-type conductivity (e.g., heavily doped n-type polysilicon (N+ polysilicon)) or polysilicon of p-type conductivity (e.g., heavily doped p-type polysilicon (P+ polysilicon)).

As shown in FIG. 7, conductive structure 503 can contact (e.g., can be electrically coupled to) semiconductor material 596. As described above, the material (e.g., doped polysilicon) of semiconductor material 596, the material (e.g., metal or doped polysilicon) of ground connection 297, or the combination of the materials of semiconductor material 596 and ground connection 297 can be part of conductive region 597 of memory device 200. Thus, conductive structure 503 can contact (e.g., can be electrically coupled to) conductive region 597 (which can include any combination of semiconductor material 596 and ground connection 297, as described above).

As shown in FIG. 7, part of portion 541F can be adjacent part of portion 510A and part of material 520 and can span across (e.g., overlap in the X-direction) part of portion 510A and part of material 520. As described above, portion 510A can form part of read channel region of transistor T1 and material 520 can form part of write channel region of transistor T2. Thus, as shown in FIG. 7, part of portion 541F can span across (e.g., overlap) part of (e.g., on a side (e.g., front side) in the Y-direction) both read and write channels of transistors T1 and T2, respectively. Although hidden from the view shown in FIG. 7 (but as can be seen in FIG. 5), part of portion 541B can be adjacent portion 510A and a part of material 520, and can span across (e.g., overlap in the X-direction) part of (e.g., on another side (e.g., back side opposite from the front side) in the Y-direction) portion 510A and a part of material 520. As shown in FIG. 7, access line 241 can also span across (e.g., overlap in the X-direction) part of portion 511A (e.g., a portion of the read channel region of transistor T1 of memory cell 211) and part of material 521 (e.g., a portion of write channel region of transistor T2 of memory cell 211).

The spanning (e.g., overlapping) of access line 241 across portion 510A and material 520 allows access line 241 (a single access line) to control (e.g., to turn on or turn off) both transistors T1 and T2 of memory cell 210 and both transistors of memory cell 211. Similarly, the spanning (e.g., overlapping) of access line 241 across portion 511A and material 521 allows access line 241 (a single access line) to control (e.g., turn on or turn off) both transistors T1 and T2 of memory cell 211.

As shown in FIG. 7, memory device 200 can include dielectric material (e.g., silicon dioxide) 526 that can form a structure (e.g., a dielectric) to electrically separate (e.g., isolate) parts of two adjacent (in the X-direction) memory cells of memory device 200. For example, dielectric material 526 can electrically separate material 520 (e.g., write channel region of transistor T2 of memory cell 210) from material 521 (e.g., write channel region of transistor T2 of memory cell 211) and electrically separate charge storage structure 202 of memory cell 210 from charge storage structure 202 of memory cell 211.

As shown in FIG. 7, memory device 200 can include a dielectric portion 531 and a dielectric portion 532 where memory cells 210 and 211 can be located between dielectric portions 531 and 532. Dielectric portion 531 can electrically isolate memory cell 210 from another memory cell (e.g., the memory cell on the left (not shown)) of memory cell 210. Dielectric portion 532 can electrically isolate memory cell 211 from another memory cell (e.g., the memory cell on the right (not shown)) of memory cell 211. The area bounded by dielectric portions 531 and 532 and semiconductor material 596 can be part of a trench (not labeled) formed during a process of forming memory device 200. Thus, memory cells 210 and 211 can be formed in part of a trench.

Some of portions (e.g., materials) of memory cells 210 and 211 can be formed adjacent (e.g., formed on) respective side walls (e.g., vertical portion with respect the Z-direction) of dielectric portions 531 and 532. For example, as shown in FIG. 7, portion 510A (e.g., semiconductor material portion) of memory cell 210 can be formed adjacent (e.g., formed on) a side wall (not labeled) of dielectric portion 531. In another example, as shown in FIG. 7, portion 511A (e.g., semiconductor material portion) of memory cell 210 can be formed adjacent (e.g., formed on) a side wall (not labeled) of dielectric portion 532.

As shown in FIG. 8A, memory device 200 can include dielectrics 518F and 518B (e.g., oxide regions) to electrically separate portions 541F and 541B of access line 241 from other elements (e.g., from portions 510A and 511A (e.g., read channel regions), charge storage structure 202, and materials 520 and 521) of memory cells 210 and 211. The material (or materials) for dielectrics 518F and 518B can be the same as (or alternatively, different from) the material (or materials) of dielectrics 515A and 515B. Example materials for portions 518F and 518B can include silicon dioxide, hafnium oxide (e.g., $HfO_2$), aluminum oxide (e.g., $Al_2O_3$), or other dielectric materials.

As shown in FIG. 8A, portions 541F and 541B can be adjacent respective sides of material 520 and charge storage structure 202 of memory cell 210. For example, portion 541F can be adjacent aside (e.g., right side in the X-direction in the view of FIG. 8A) of a portion of each of material 520 and charge storage structure 202. In another example, portion 541B can be adjacent another side (e.g., left side (opposite from the right side) in the X-direction in the view of FIG. 8A) of a portion of each of material 520 and charge storage structure 202.

The above description focuses on the structure of memory cell 210. Memory cell 211 can include elements structured in ways similar or identical to the elements of memory cell 210, described above. For example, as shown in FIG. 7, memory cell 211 can include charge storage structure 202, channel region (e.g., write channel region) 521, portions 511A and 511B (e.g., read channel region), and dielectrics 525A and 525B. The material (or materials) for dielectrics 525A and 525B can the same as the material (or materials) for dielectrics 515A and 515B.

As described above with reference to FIG. 2 through FIG. 8B, the connection and structure of memory device 200 can allow a cross-point operation in that a memory cell (e.g. memory cell 210) of memory device 200 can be accessed using a single access line (e.g., access line 241) and a single data line (e.g., data line 221) during an operation (e.g., a read or write operation) of memory device 200. Such a cross-point operation can be achieved due in part to a terminal (e.g., a source terminal) of transistor T1 of each of the memory cells (e.g., memory cell 210 through 215) being coupled to a ground connection (e.g., ground connection 297). This ground connection allows a voltage level at a terminal (e.g., source terminal) of transistor T1 of a selected memory cell to remain unchanged (e.g., remain unswitched at 0V), thereby allowing the cross-point operation. The cross-point operation and the structure of memory device 200 can provide better memory performance in comparison with some conventional volatile memory devices (e.g., DRAM devices).

FIG. 9 through FIG. 22 show different views of elements during processes of forming a memory device 900, according to some embodiments described herein. Some or all of the processes used to form memory device 900 can be used to form memory device 200 described above with reference to FIG. 2 through FIG. 8B.

Figure 9:
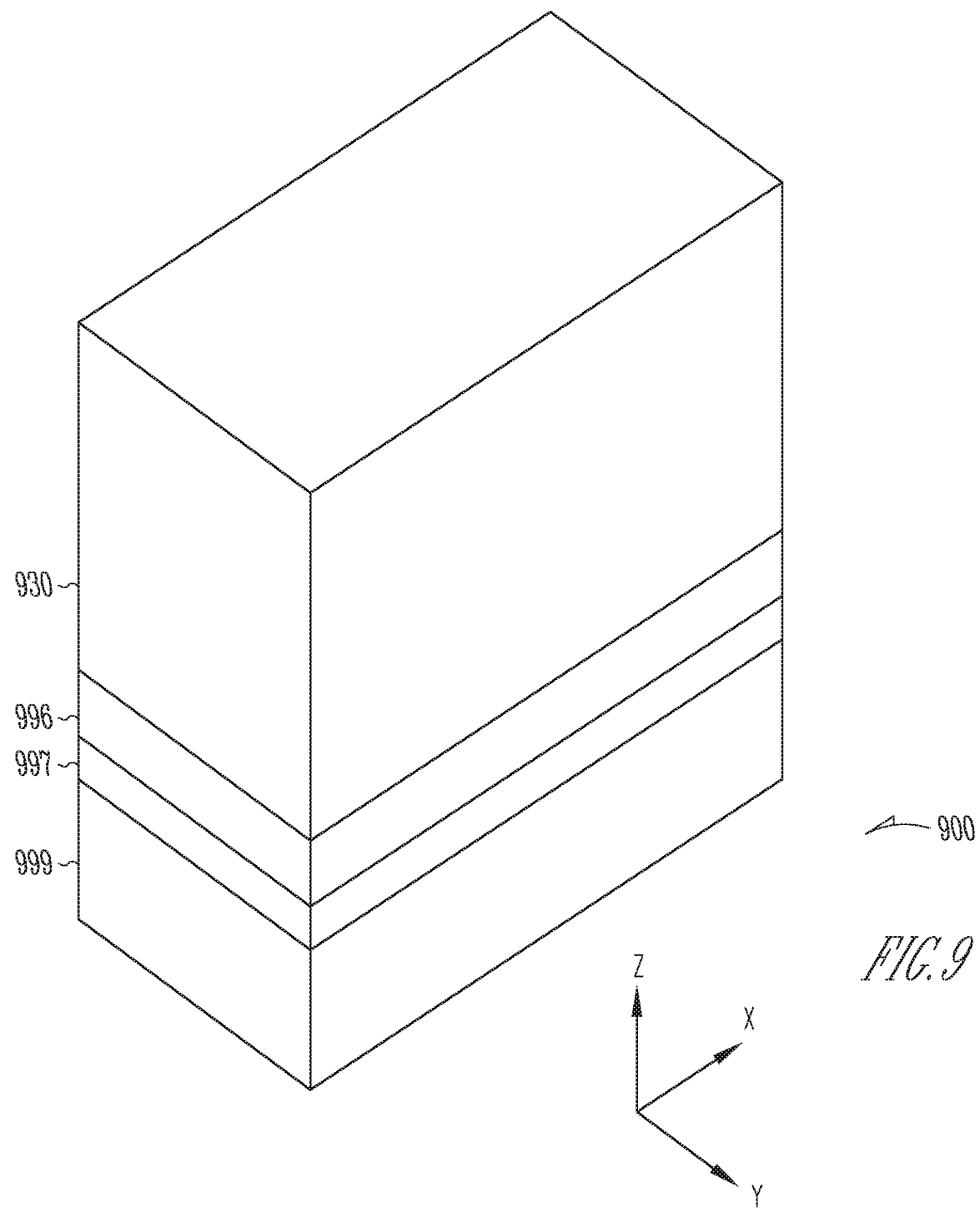
FIG. 9 through FIG. 22 show processes of forming a memory device, according to some embodiments described herein.

FIG. 9 shows memory device 900 after different levels (e.g., layers) of materials are formed in respective levels (e.g., layers) of memory device 900 in the Z-direction over a substrate 999. The different levels of materials include a dielectric material 930, a semiconductor material 996, and a conductive material 997. Dielectric material 930, semiconductor material 996, and conductive material 997 can be formed in a sequential fashion one material after another over substrate 999. For example, the processes used in FIG. 9 can include forming (e.g., depositing) conductive material 997 over substrate 999, forming (e.g., depositing) semiconductor material 996 over conductive material 997, and forming (e.g., depositing) dielectric material 930 over semiconductor material 996.

Substrate 999 can be similar to or identical to substrate 599 of FIG. 5. Conductive material 997 can include a material (or materials) similar to or identical to that of the material for ground connection 297 of memory device 200 (FIG. 5 through FIG. 8B). For example, conductive material 997 can include metal, conductively doped polysilicon, or other conductive materials.

Semiconductor material 996 includes a material (or materials) similar to or identical to that of the material for semiconductor material 596 of memory device 200 (FIG. 5 through FIG. 8B). For example, semiconductor material 996 can include silicon, polysilicon, or other semiconductor material, and can include a doped region (e.g., p-type doped region). As described below in subsequent processes of forming memory device 900, semiconductor material 996 can be structured to form part of a channel region (e.g., read channel region) for a respective memory cell of memory device 900.

Dielectric materials 930 of FIG. 9 can include a nitride material (e.g., silicon nitride (e.g., $Si_3N_4$)), oxide material (e.g., $SiO_2$)), or other dielectric materials. As described below in subsequent processes of forming memory device 900, dielectric material 930 can be processed into dielectric portions to form part of cell isolation structures to electrically isolate one memory cell from another memory cell of memory device 900.

Figure 10:
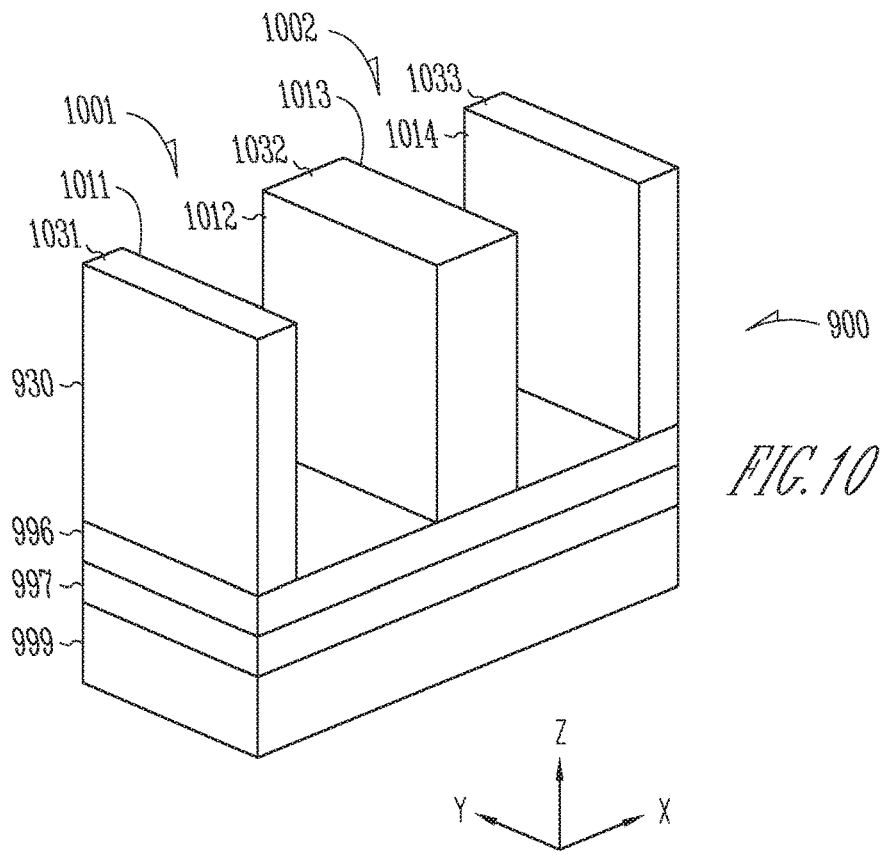

FIG. 10 shows memory device 900 after trenches (e.g., openings) 1001 and 1002 are formed. Forming trenches 1001 and 1002 can include removing (e.g., by patterning) part of dielectric material 930 (FIG. 9) at the locations of trenches 1001 and 1002 and leaving portions (e.g., dielectric portions) 1031, 1032, and 1033 (which are remaining portions of dielectric material 930) as shown in FIG. 10.

Each of trenches 1001 and 1002 can have a length in the Y-direction, a width (shorter than the length) in the X-direction, and a bottom (not labeled) resting on (e.g., bounded by) a respective portion of semiconductor material 996. Each of trenches 1001 and 1002 can include opposing side walls (e.g., vertical side walls) formed by respective portions 1031, 1032, and 1033. For example, trench 1001 can include a side wall 1011 (formed by portion 1031) and a side wall 1012 (formed by portion 1032). Trench 1002 can include a side wall 1013 (formed by portion 1032) and a side wall 1014 (formed by portion 1033).

Figure 11:
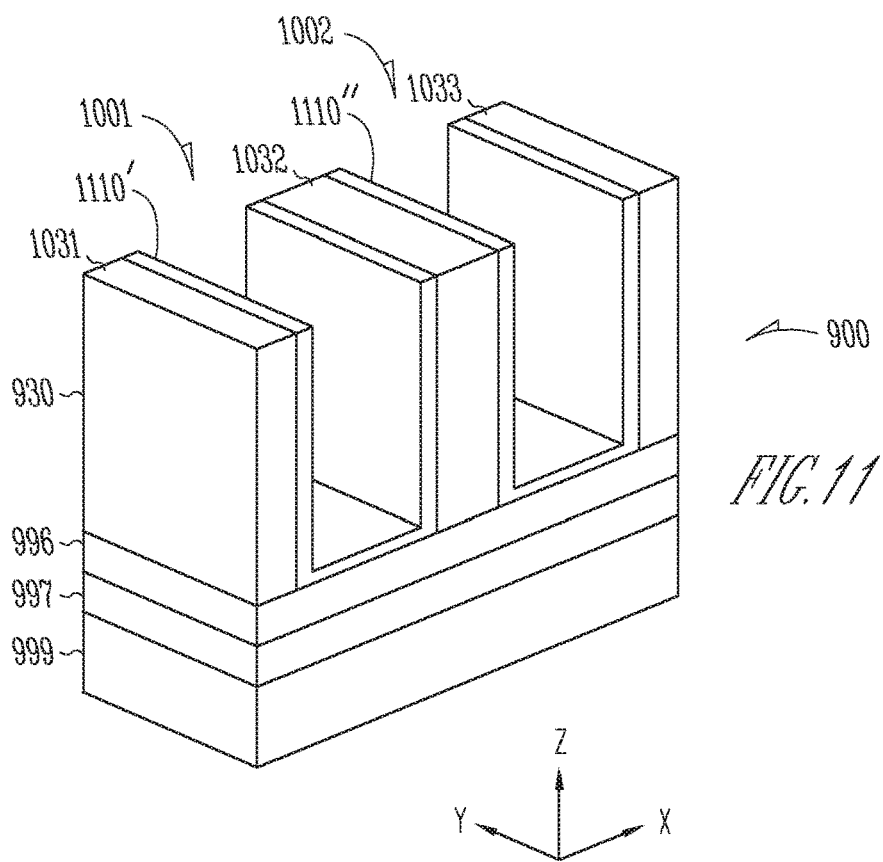

FIG. 11 shows memory device 900 after a material 1110' and a material 1110" are formed (e.g., deposited) in trenches 1001 and 1002, respectively. As shown in FIG. 11, material 1110' can be formed on side walls 1011 and 1012 and on the bottom (e.g., on a portion of semiconductor material 996) of trench 1001. Material 1110" can be formed on side walls 1013 and 1014 and on the bottom (e.g., on another portion of semiconductor material 996) of trench 1002.

Materials 1110' and 1110" can be the same material. An example of material 1110' and material 1110" includes a semiconductor material. Materials 1110' and 1110" can have the same properties as the materials that form portions 510A, 510B, 511A, and 511B (e.g., read channel regions) of transistors T1 of respective memory cells of memory device 200 of FIG. 5 through FIG. 8B. As described below in subsequent processes (e.g., FIG. 19) of forming memory device 900, materials 1110' and 1110" can be structured to form channel regions (e.g., read channel regions) of transistors (e.g., transistors T1) of respective memory cells of memory device 900. Thus, each of materials 1110' and 1110" can conduct a current (e.g., conduct holes) during an operation (e.g., a read operation) of memory device 900.

The process of forming materials 1110' and 1110" can include a doping process. Such a doping process can include introducing dopants into materials 1110' and 1110" to allow a transistor (e.g., transistor T1) of a respective memory cell of memory device 900 to include a specific structure. For example, the doping process used in FIG. 9 can include introducing dopants (e.g., using a laser anneal process) with different dopant concentrations for different parts of materials 1110' and 1110", such that the transistor that includes material 1110' (or material 1110") can have a PFET structure. In such a PFET structure, part of material 1110' (or material 1110") can form a channel region (e.g., read channel region) to conduct currents (e.g., holes) during an operation (e.g., read operation) of memory device 900.

Figure 12:
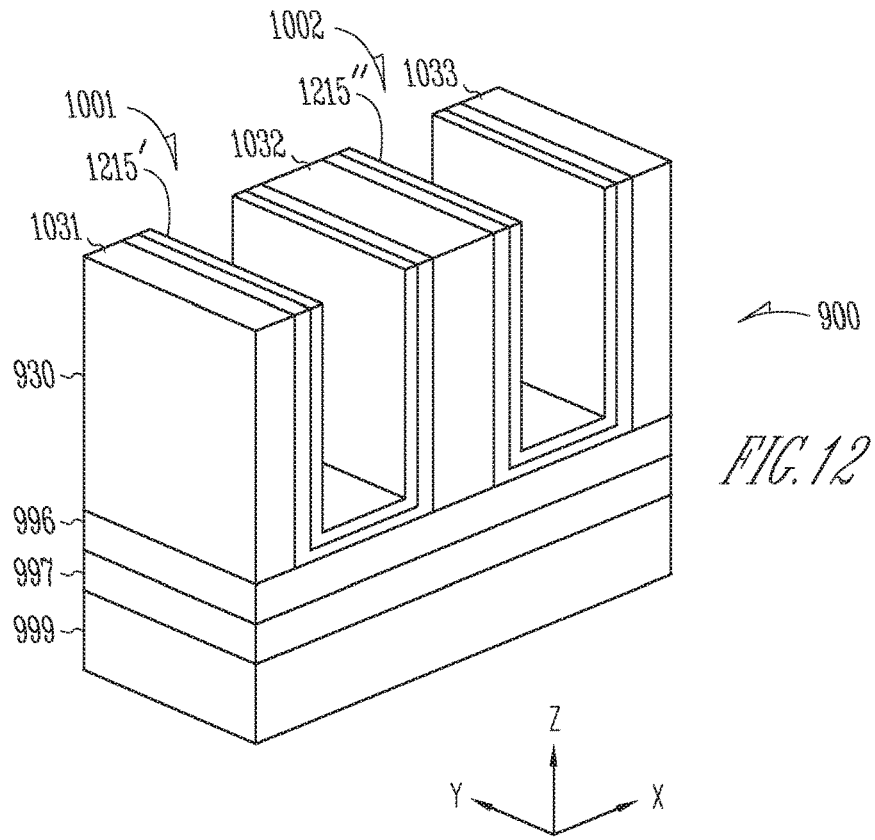

FIG. 12 shows memory device 900 after dielectric materials (e.g., oxide materials) 1215' and 1215" are formed (e.g., deposited) on materials 1110' and 1110", respectively. Dielectric materials 1215' and 1215" can be deposited, such that dielectric materials 1215' and 1215" can be conformal to materials 1110' and 1110", respectively. Materials 1215' and 1215" can have the same properties as the materials (e.g., oxide materials) that form dielectrics 515A, 515B, 525A, and 525B of memory device 200 of FIG. 5 through FIG. 8B.

Figure 13:
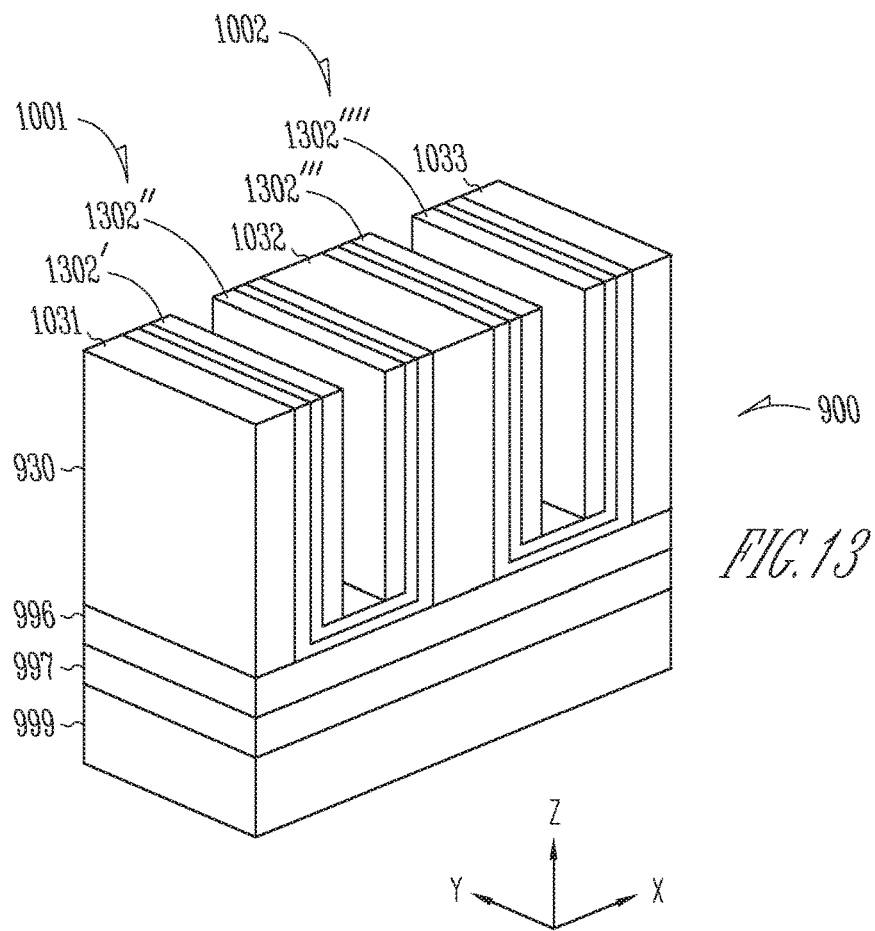

FIG. 13 shows memory device 900 after materials (e.g., charge storage materials) 1302', 1302", 1302''', and 1302'''' are formed on respective side walls of materials 1215' and 1215". Materials 1302', 1302", 1302''', and 1302'''' are electrically separated from each other. As described below in subsequent processes (FIG. 19) of forming memory device 900, each of materials 1302', 1302", 1302''', 1302'''' can be structured to form a charge storage structure of a respective memory cell of memory device 900. Materials 1302', 1302", 1302''', 1302'''' can include material (e.g., polysilicon) similar or identical to the material of charge storage structure 202 of the memory cells (e.g., memory cell 210 or 211) of memory device 200 (FIG. 5 through FIG. 8B).

Figure 14:
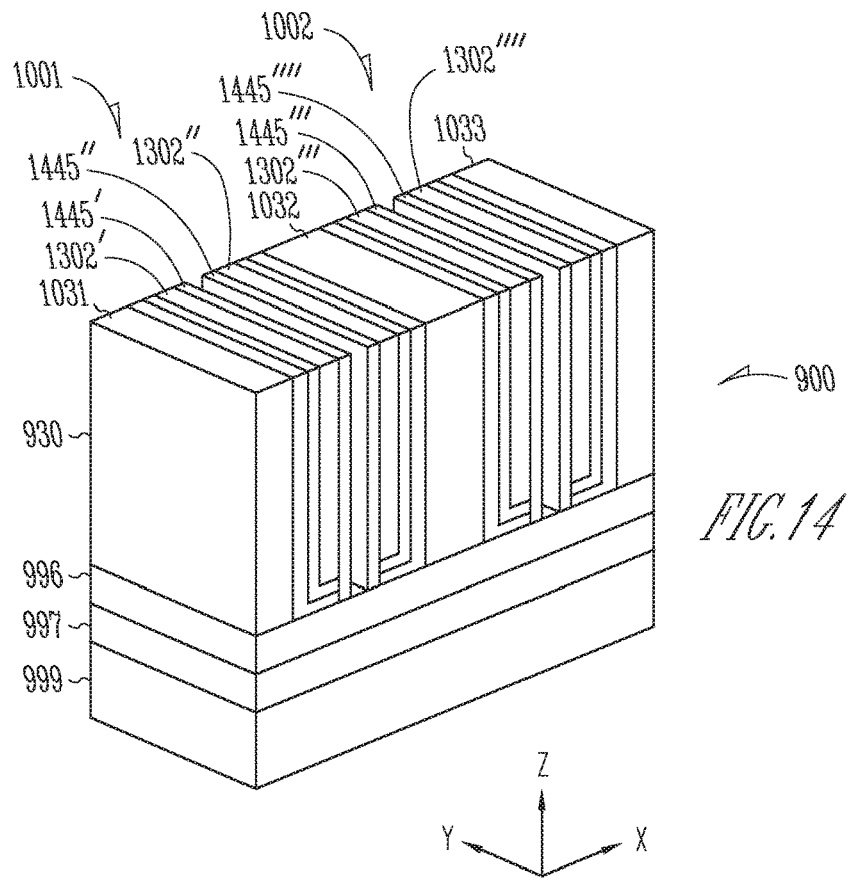

FIG. 14 shows memory device 900 after dielectric materials 1445', 1445", 1445''', and 1445'''' are formed on respective side walls of materials 1302', 1302", 1302''', and 1302'''. Dielectric materials 1445', 1445", 1445''', and 1445'''' can include an oxide material (e.g., silicon dioxide). Dielectric materials 1445', 1445", 1445''', and 1445'''' can have the same properties as the materials (e.g., oxide materials) that form dielectrics 545A and 545B of memory device 200 of FIG. 5 through FIG. 8B.

As shown in FIG. 14, dielectric materials 1445', 1445", 1445''', and 1445'''' can be formed such that portions of semiconductor material 996 at trenches 1001 and 1002 are not covered by (e.g., are void of) dielectric materials 1445', 1445", 1445''', and 1445''''. Thus, portions of semiconductor material 996 can be exposed at trenches 1001 and 1002 after dielectric materials 1445', 1445", 1445''', and 1445'''' are formed.

Figure 15:
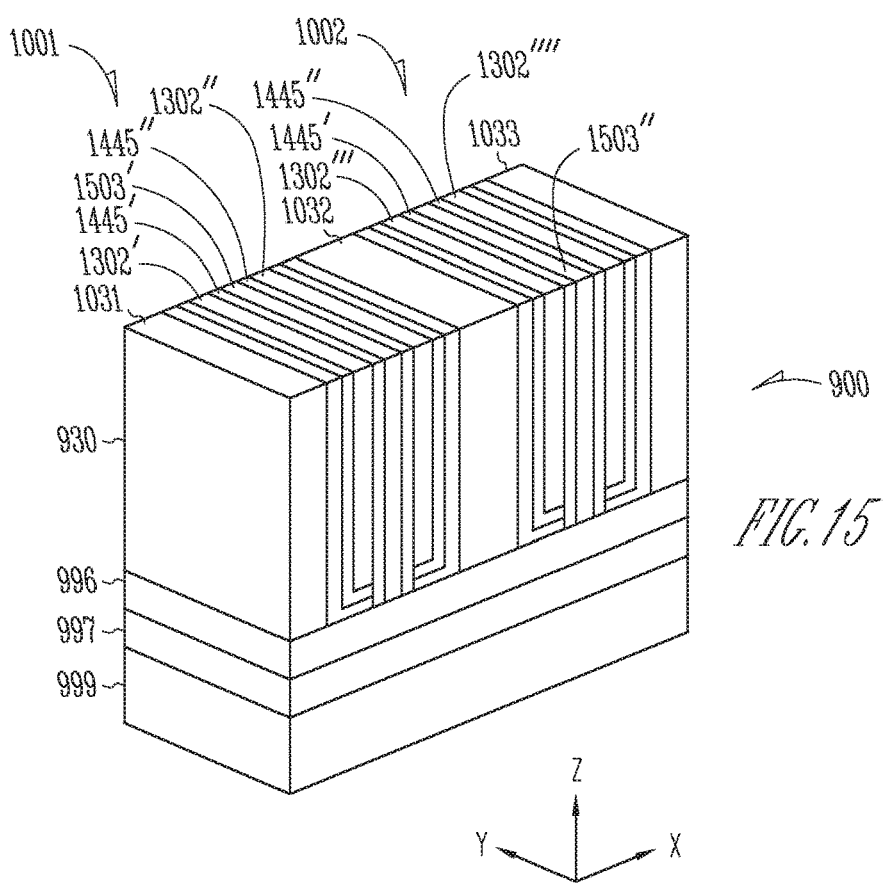

FIG. 15 shows memory device 900 after conductive materials 1503' and 1503" are formed (e.g., filled) in opened spaces in trenches 1001 and 1002, respectively. Forming conductive materials 1503' and 1503" can include depositing conductive materials 1503' and 1503" in trenches 1001 and 1002, respectively, such that conductive materials 1503' and 1503" can contact (e.g., can be electrically coupled to) respective portions of semiconductor material 596 (that were exposed in the process associated with FIG. 14).

Conductive materials 1503' and 1503''' can have the same properties as the materials that form conductive structures 503 of memory device 200 of FIG. 5 through FIG. 8B. For example, conductive materials 1503' and 1503" can include metal, polysilicon (e.g., conductively doped polysilicon), or other conductive material (or a combination of conductive materials). As described below in subsequent processes of forming memory device 900, conductive materials 1503' and 1503" can form part of conductive structures (e.g., capacitive coupling isolation structures) that can electrically isolate charge storage structures of adjacent memory cells of memory device 900.

Figure 16:
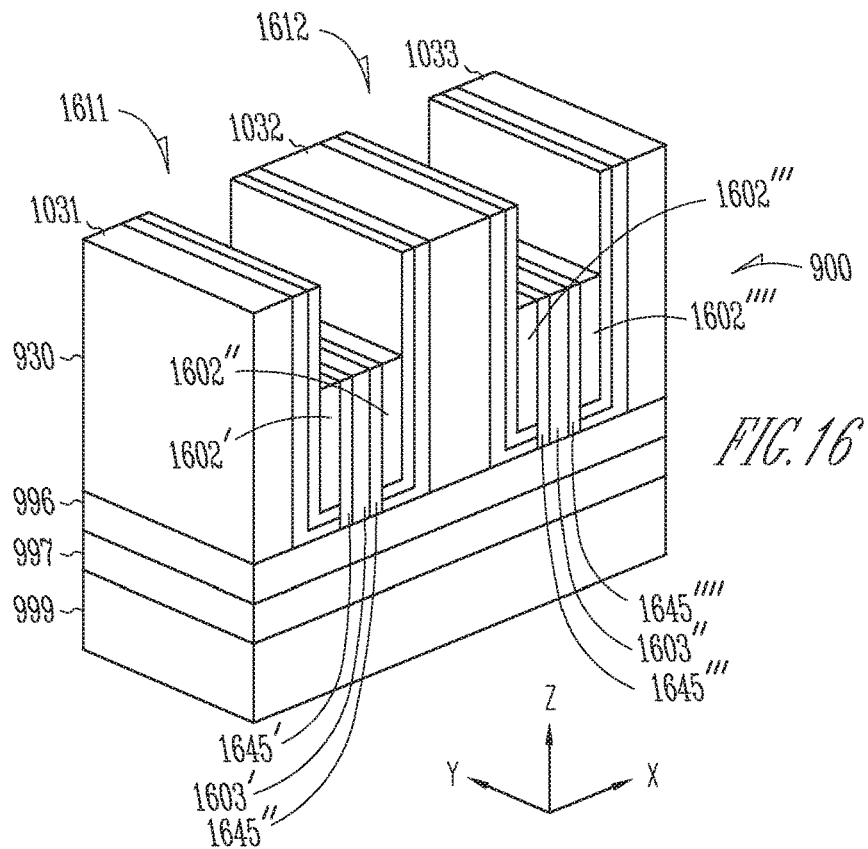

FIG. 16 shows memory device 900 after materials 1602', 1602", 1602''', and 1602''''; dielectric materials 1645', 1645", 1645''', and 1645''''; and conductive materials 1603' and 1603" are formed. Forming materials 1602', 1602", 1602''', and 1602'''' can include removing (e.g., by using an etch process) part (e.g., top part) of each of dielectric materials 1302', 1302", 1302''', and 1302'''' (FIG. 15), such that the remaining parts of materials 1302', 1302", 1302''', and 1302'''' are materials 1602', 1602", 1602''', and 1602'''' (FIG. 16), respectively. Forming dielectric materials 1645', 1645", 1645''', and 1645'''' can include removing (e.g., by using an etch process) part (e.g., top part) of each of dielectric materials 1445', 1445", 1445''', and 1445'''' (FIG. 15), such that the remaining parts of dielectric materials 1445', 1445", 1445''', and 1445'''' are dielectric materials 1645', 1645", 1645''', and 1645'''' (FIG. 16), respectively. Forming conductive materials 1603' and 1603" can include removing (e.g., by using an etch process) part (e.g., top part) of each of conductive materials 1503' and 1503" (FIG. 15), such that the remaining parts of conductive materials 1503' and 1503" are conductive materials 1603' and 1603" (FIG. 16), respectively.

In FIG. 16, part (e.g., top part) of materials 1302', 1302", 1302''', 1302''''; part (e.g., top part) of dielectric materials 1445', 1445", 1445''', and 1445''''; and conductive materials 1503' and 1503" can be removed in a single process (e.g., single step) or in separate processes (e.g., multiple steps). For example, part of materials 1302', 1302", 1302''', 1302'''' (FIG. 15) can be removed in a process that is different from the process (or processes) of removing part of dielectric materials 1445', 1445", 1445''', and 1445'''' (FIG. 15), and/or different from the process that removes conductive materials 1503' and 1503" (FIG. 15).

Figure 17:
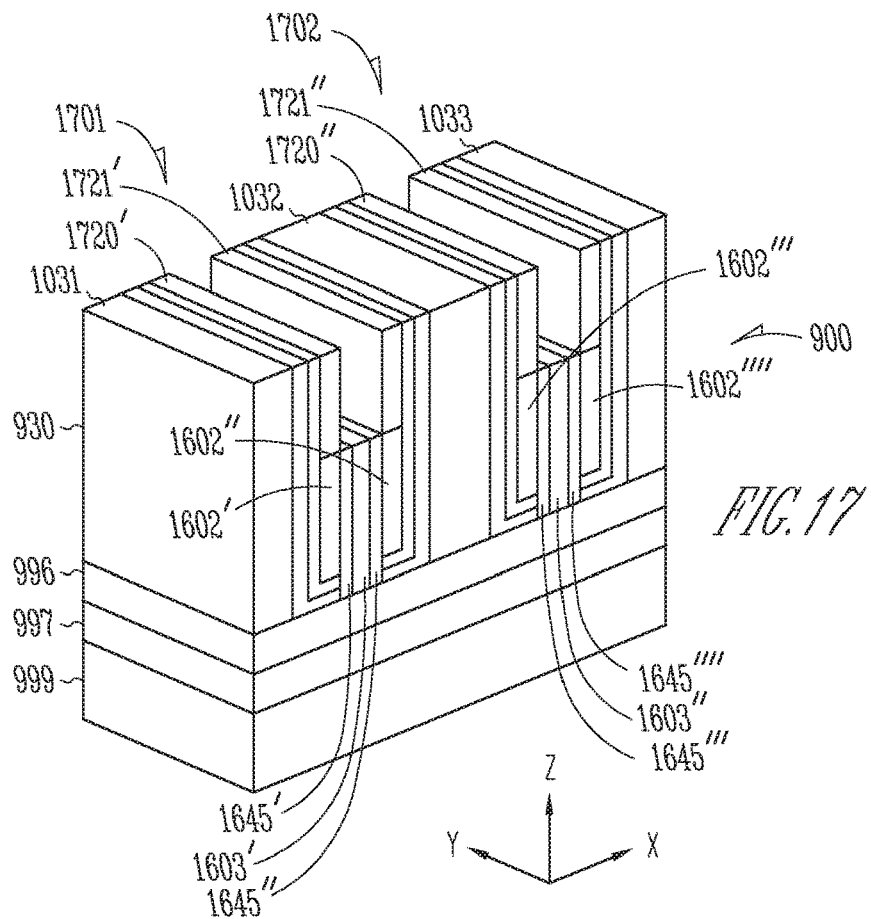

FIG. 17 shows memory device 900 after materials 1720', 1721', 1720", and 1721" are formed. Forming materials 1720', 1721', 1720", and 1721" can include depositing an initial material (or materials) on materials 1602', 1602", 1602''', and 1602''''; dielectric materials 1645', 1645", 1645''', and 1645'''', and conductive materials 1603' and 1603". Then, the process used in FIG. 17 can include removing (e.g., by using an etch process) a portion of the initial material at locations 1701 and 1702. Materials 1720', 1721', 1720", and 1721" are the remaining portions of the initial material. As shown in FIG. 17, materials 1720', 1721', 1720", and 1721" are electrically separated from each other. However, materials 1720', 1721', 1720", and 1721" are electrically coupled to (e.g., directly coupled to) materials 1602', 1602", 1602''', and 1602'''', respectively.

Materials 1720', 1721', 1720", and 1721" can include materials similar or identical to material (e.g., write channel region) 520 or 521 (FIG. 5) of transistor T2 of memory device 200 of FIG. 5 through FIG. 8B. As described below in subsequent processes (FIG. 19) of forming memory device 900, each of materials 1720', 1721', 1720", and 1721" can form a channel region (e.g., write channel region) of a transistor (e.g., transistor T2) of a respective memory cell of memory device 900. Thus, each of materials 1720', 1721', 1720", and 1721" can conduct a current (e.g., conduct electrons) during an operation (e.g., a write operation) of memory device 900.

Figure 18:
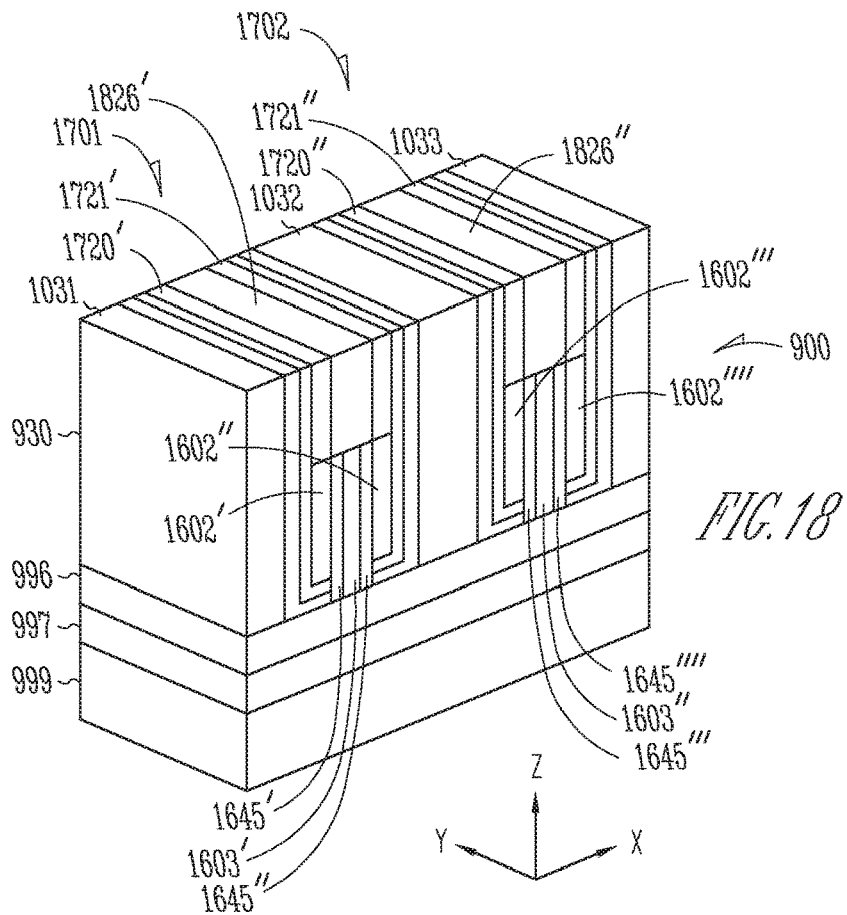

FIG. 18 shows memory device 900 after dielectric materials 1826' and 1826" are formed at (e.g., filled in) locations 1701 and 1702 (FIG. 17). Dielectric materials 1826' and 1826" can include the same material (e.g., silicon dioxide) as dielectric material 526 of FIG. 7. As described below in subsequent processes of forming memory device 900, dielectric materials 1826' and 1826" can form part of an isolation structure that can electrically isolate parts of (e.g., write channel regions) two adjacent (in the X-direction) memory cells of memory device 900.

Figure 19:
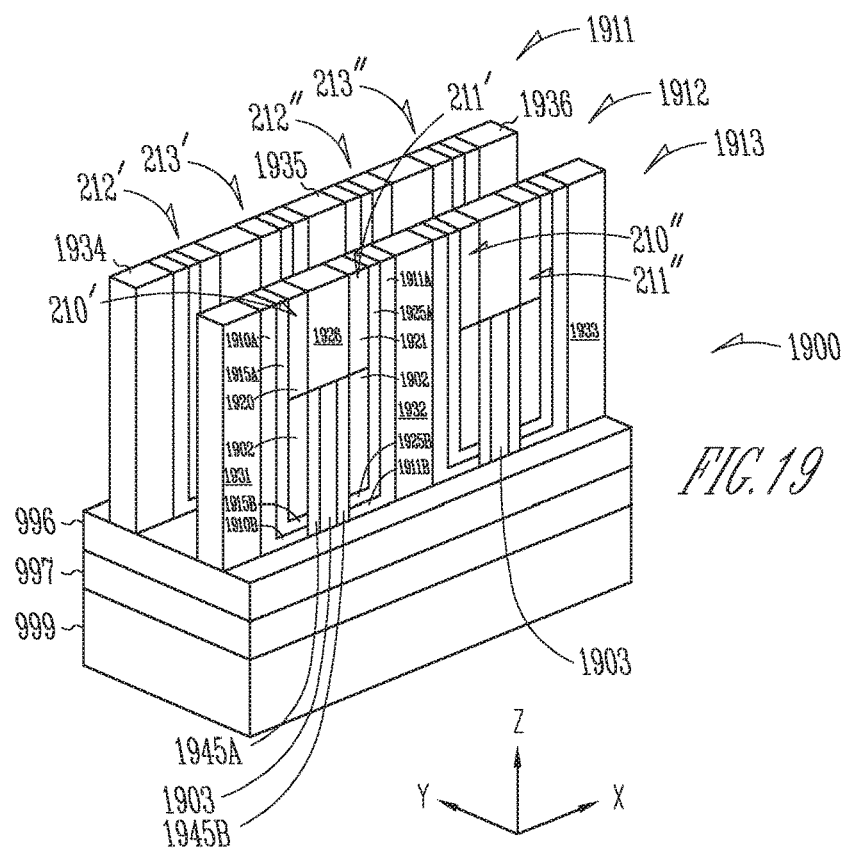

FIG. 19 shows memory device 900 after trenches 1911, 1912, and 1913 are formed (in the X-direction) across the materials of memory device 900. Each of trenches 1911, 1912, and 1913 can have a length in the X-direction, a width (shorter than the length) in the Y-direction, and a bottom (not labeled) resting on (e.g., bounded by) a respective portion of semiconductor material 996. Alternatively, each of trenches 1911, 1912, and 1913 can have a bottom (not labeled) resting on (e.g., bounded by) a respective portion of conductive material 997 (instead of semiconductor material 996). Forming trenches 1911, 1912, and 1913 can include removing (e.g., by cutting (e.g., etching) in the Z-direction) part of the materials of memory device 900 at locations of trenches 1911, 1912, and 1913 and leaving portions (e.g., slices) of the structure of memory device 900 shown in FIG. 19.

After portions (at the locations of trenches 1911, 1912, and 1913) of memory device 900 are removed (e.g., cut), the remaining portions can form parts of memory cells and shields (e.g., capacitive coupling isolation structures) between adjacent charge storage structures of adjacent memory cells of memory device 900. For example, memory device 900 can include memory cells 210', 211', 210", and 211" in one row along the X-direction, and cells 212', 213', 212", and 213" in another row along the X-direction. Memory cells 210' and 211' can correspond to memory cells 210 and 211, respectively, of memory device 200 (FIG. 2 and FIG. 7). Memory cells 212' and 213' in FIG. 19 can correspond to memory cells 212 and 213, respectively, of memory device 200 (FIG. 2).

For simplicity, only some of similar elements (portions) of memory device 900 in FIG. 19 are labeled. For example, memory device 900 can include dielectric portions (e.g., cell isolation structures) 1931, 1932, 1933, 1934, 1935, and 1936, and dielectric material 1926. Dielectric portions 1931 and 1932 can correspond to dielectric portions 531 and 532, respectively, of memory device 200 of FIG. 7.

As shown in FIG. 19, memory cell 210' can include portions 1910A and 1910B (which can be part of the read channel region of memory cell 210'), dielectrics 1915A and 1915B, material (e.g., write channel region) 1920, and charge storage structure 1902 (directly below material 1920). Memory cell 211' can include portions 1911A and 1911B (which can be part of the read channel region of memory cell 211'), dielectrics 1925A and 1925B, material (e.g., write channel region) 1921, and charge storage structure 1902 (directly below material 1921).

Memory device 900 can include conductive structures 1903, which are parts of the respective remaining portions of conductive materials 1603' and 1603" (FIG. 18) after trenches 1911, 1912, and 1913 (FIG. 19) are formed. Each of conductive structures 1903 can correspond to conductive structure 503 (FIG. 7) of memory device 200. In FIG. 19, each of conductive structures 1903 can be a shield (e.g., a capacitive coupling isolation structure) between adjacent charge storage structures 1902 of adjacent memory cells of memory device 900. For example, conductive structure 1903 between memory cells 210' and 211' can be a shield (e.g., a capacitive coupling isolation structure) between memory cells 210' and 211'.

As described above with reference to FIG. 9 through FIG. 19, part of each of the memory cells of memory device 900 can be formed from a self-aligned process, which can include formation of trenches 1001 and 1002 in the Y-direction and trenches 1911, 1912, and 1913 in the X-direction. The self-aligned process can improve (e.g., increase) memory cell density, improve process (e.g., provide a higher process margin), or both. The self-aligned process, as described above, includes a reduced number of critical masks that can allow forming of multiple decks of memory cells in the same memory device. An example of a multi-deck memory device is described below with reference to FIG. 29A through FIG. 29C.

Figure 20:
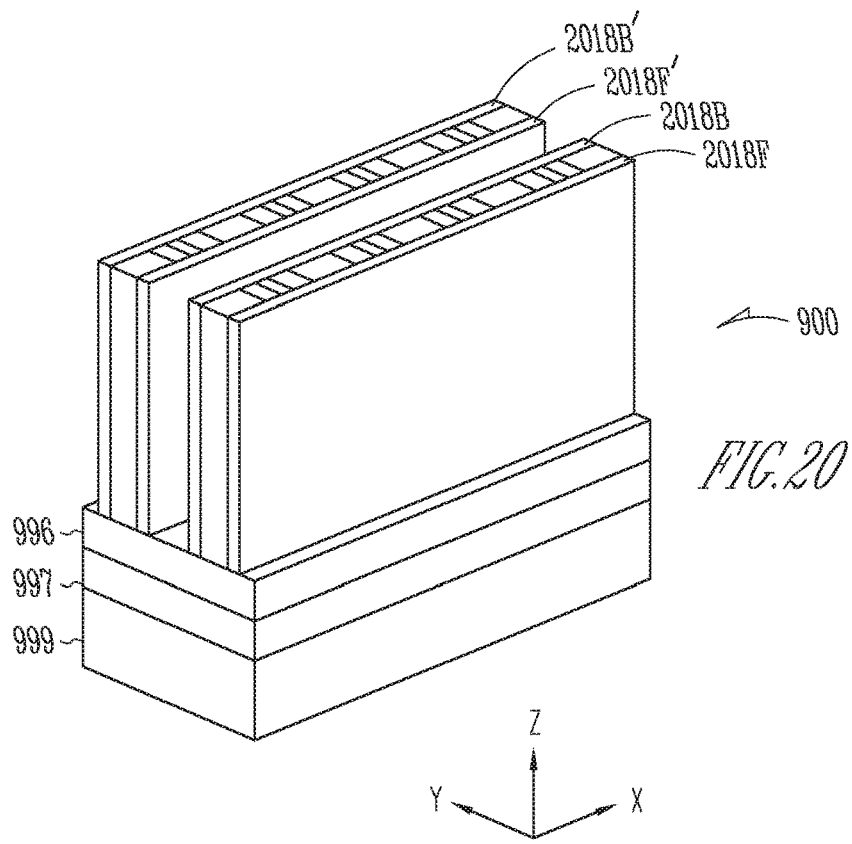

FIG. 20 shows memory device 900 after dielectrics 2018F, 2018B, 2018F', and 2018B' (e.g., oxide regions) are formed. The material (or materials) for dielectrics 2018F, 2018B, 2018F', and 2018B' can be the same as (or alternatively, different from) the material (or materials) of dielectrics 515A, 515B, 525A, and 525B. Example materials for dielectrics 2018F, 2018B, 2018F', and 2018B' can include silicon dioxide, hafnium oxide (e.g., HfO2), aluminum oxide (e.g., Al2O3), or other dielectric materials.

Figure 21:
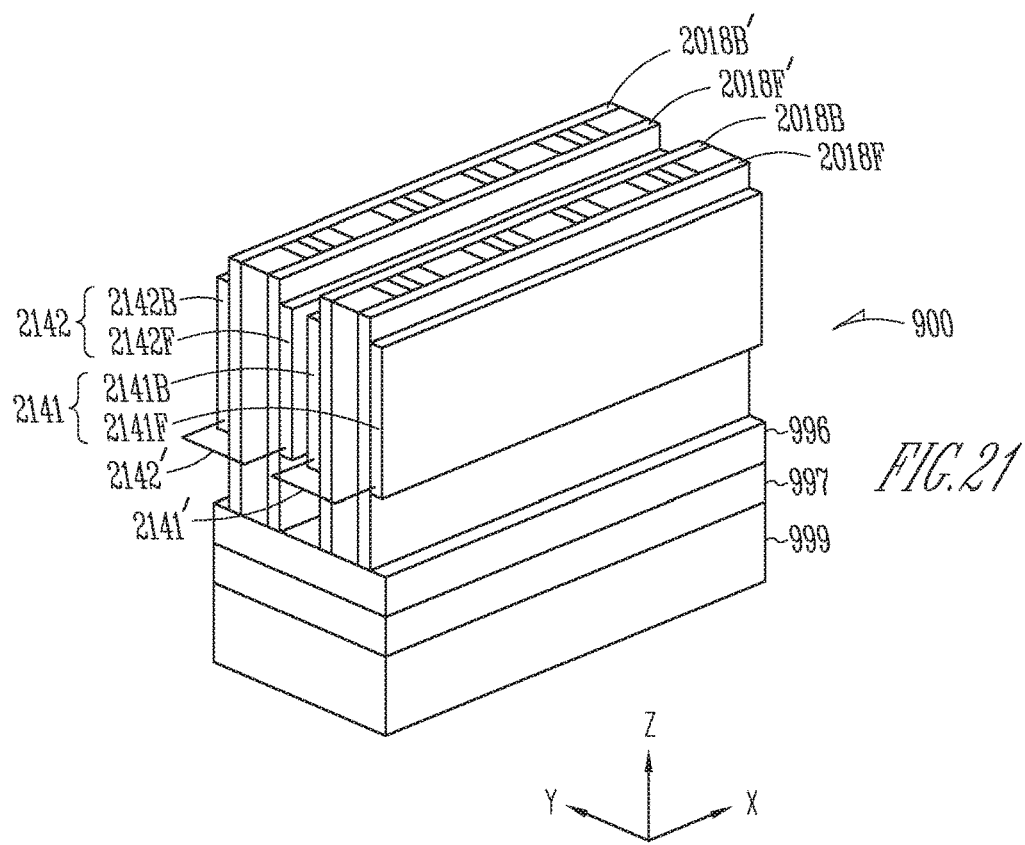

FIG. 21 shows memory device 900 after conductive lines (e.g., conductive regions) 2141F, 2141B, 2142F, and 2142B are formed. Each of conductive lines 2141F, 2141B, 2142F, and 2142B can include metal, conductively doped polysilicon, or other conductive materials. As shown in FIG. 21, conductive lines 2141F, 2141B, 2142F, and 2142B are electrically separated from other elements of memory device 900 by dielectrics 2018F, 2018B, 2018F', and 2018B', respectively.

Conductive lines 2141F and 2141B can form part of an access line (e.g., word line) 2141 to control the read and write transistors (e.g., transistor T1 and T2, respectively) of respective memory cells 210', 211', 210", and 211" of memory device 900. For example, conductive lines 2141F and 2141B can form front and back conductive portions, respectively, of access line 2141. Conductive lines 2142F and 2142B can form part of an access line (e.g., word line) 2142 to access memory cells 212', 213', 212", and 213" of memory device 900. For example, conductive lines 2142F and 2142B can form front and back conductive portions, respectively, of access line 2142. Access lines 2141 and 2412 can correspond to access lines 241 and 242, respectively, of memory device 200 (e.g., FIG. 2 and FIG. 8B).

The processes of forming memory device 900 in FIG. 21 can include forming a conductive connection 2141' (which can include a conductive material (e.g., metal)) to electrically couple conductive lines 2141F and 2141B to each other. This allows conductive lines 2141F and 2141B to form part of or a single access line (e.g., access line 2141). Similarly, the processes of forming memory device 900 can include forming a conductive connection 2142' to electrically couple conductive lines 2142F and 2142B to each other. This allows conductive lines 2142F and 2142B to form part or a single access line (e.g., access line 2142).

Figure 22:
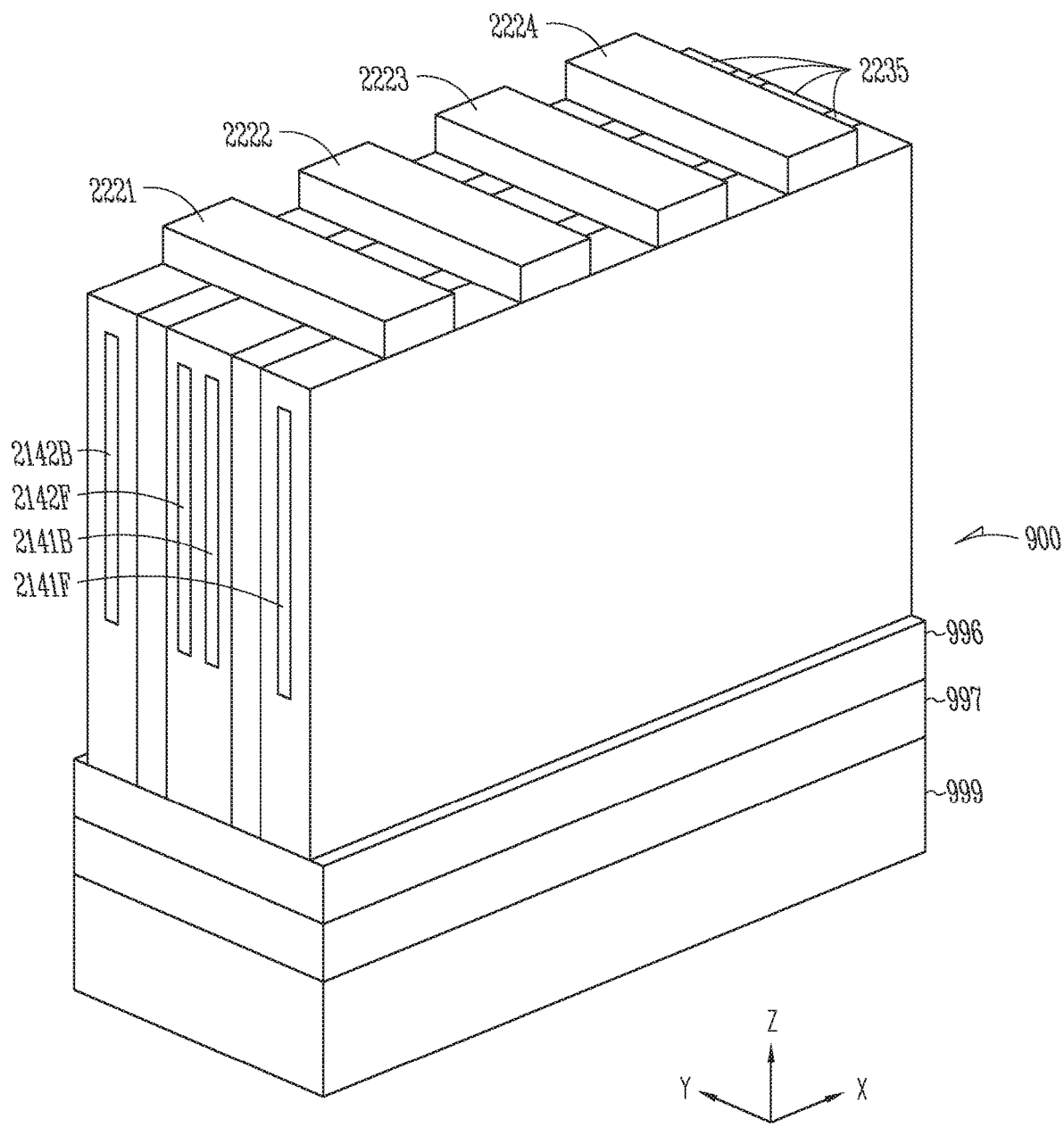

FIG. 22 shows memory device 900 after data lines 2221, 2222, 2223, and 2224 are formed. Each of data lines 2221, 2222, 2223, and 2224 can have a length the Y-direction, a width in the X-direction, and a thickness in the Z-direction. Data lines 2221, 2222, 2223, and 2224 can correspond to data lines 221, 222, 223, and 224, respectively, of memory device 200 (e.g., FIG. 8B).

In FIG. 22, data lines 2221, 2222, 2223, and 2224 can be electrically coupled to (e.g., contact) a respective portion of each of the memory cells in the Y-direction of memory device 900. For example, data line 2221 can be electrically coupled to portion 1910A (part of a read channel region of memory cell 210') and material 1920 (part of a write channel region of memory cell 210'). Data line 2221 can be also be electrically coupled to a read channel region (not labeled) of memory cell 212' and write channel region (not labeled) of memory cell 212'.

The description of forming memory device 900 with reference to FIG. 9 through FIG. 22 can include other processes to form a complete memory device. Such processes are omitted from the above description so as to not obscure the subject matter described herein.

The process of forming memory device 900 as described above can have a relatively reduced number of masks (e.g., reduced number of critical masks) in comparison with some conventional processes. For example, by forming trenches 1001 and 1002 in the process associated with FIG. 10, and forming trenches 1911, 1912, and 1913 in the process of FIG. 19, the number of critical masks used to form the memory cells of memory device 900 can be reduced. The reduced number of masks can simplify the process, reduce cost, or both, of forming memory device 900.

FIG. 23A through FIG. 28 show portions of the structures of memory devices 2300A, 2400A, 2500A, and 2700A, respectively, that can be variations of memory device 200, according to some embodiments described herein. For simplicity, similar or identical elements among memory devices 200, 2300A, 2400A, 2500A, and 2700A are given the same labels.

FIG. 23A shows a top view of memory device 2300A that can be a variation of the top view in FIG. 8B of memory device 200. As shown in FIG. 23A, memory device 2300A can include conductive structures 2303 located between respective charge storage structures 202. Conductive structures 2303 can be similar to conductive structures 503 of memory device 200 described above with reference to FIG. 5 through FIG. 5B. For example, each of conductive structures 2303 in FIG. 23A can be a shield (e.g., a capacitive coupling isolation structure) between adjacent charge storage structures of adjacent memory cells of memory device 2300A to reduce capacitive coupling between charge storage structures 202 of adjacent memory cells of memory device 2300A.

Like conductive structure 503 (FIG. 7 and FIG. 8B), each of conductive structures 2303 of FIG. 23A can contact (e.g., can be electrically coupled to) conductive region 597. As described above with reference to FIG. 5 through FIG. 8B, conductive region 597 can include any combination of semiconductor material 596 and ground connection 297.

Differences between memory device 200 (FIG. 8B) and memory device 2300A (FIG. 23A) include the differences in the structures of conductive structure 503 (FIG. 8B) and conductive structure 2303 (FIG. 23A). As shown in FIG. 23A, each of conductive structures 2303 of memory device 2300A can extend continuously (e.g., can have a length) in the Y-direction between charge storage structures 202 of respective memory cell pairs located (e.g., located in the same column) in the Y-direction. For example, conductive structure 2303 (between memory cells 210 and 211) can extend continuously in the Y-direction between charge storage structures 202 of memory cells 210 and 211 and between charge storage structures 202 memory cells 212 and 213. In another example, conductive structure 2303 (between memory cells 210' and 211') can extend continuously in the Y-direction between charge storage structures 202 of memory cells 210' and 211' and between charge storage structures 202 memory cells 212' and 213'. Conductive structures 2303 can provide improvements to memory device 2300A that can be similar to improvements provided by conductive structures 503 to memory device 200, as described above with reference to FIG. 5 through FIG. 8B.

Figure 23B:
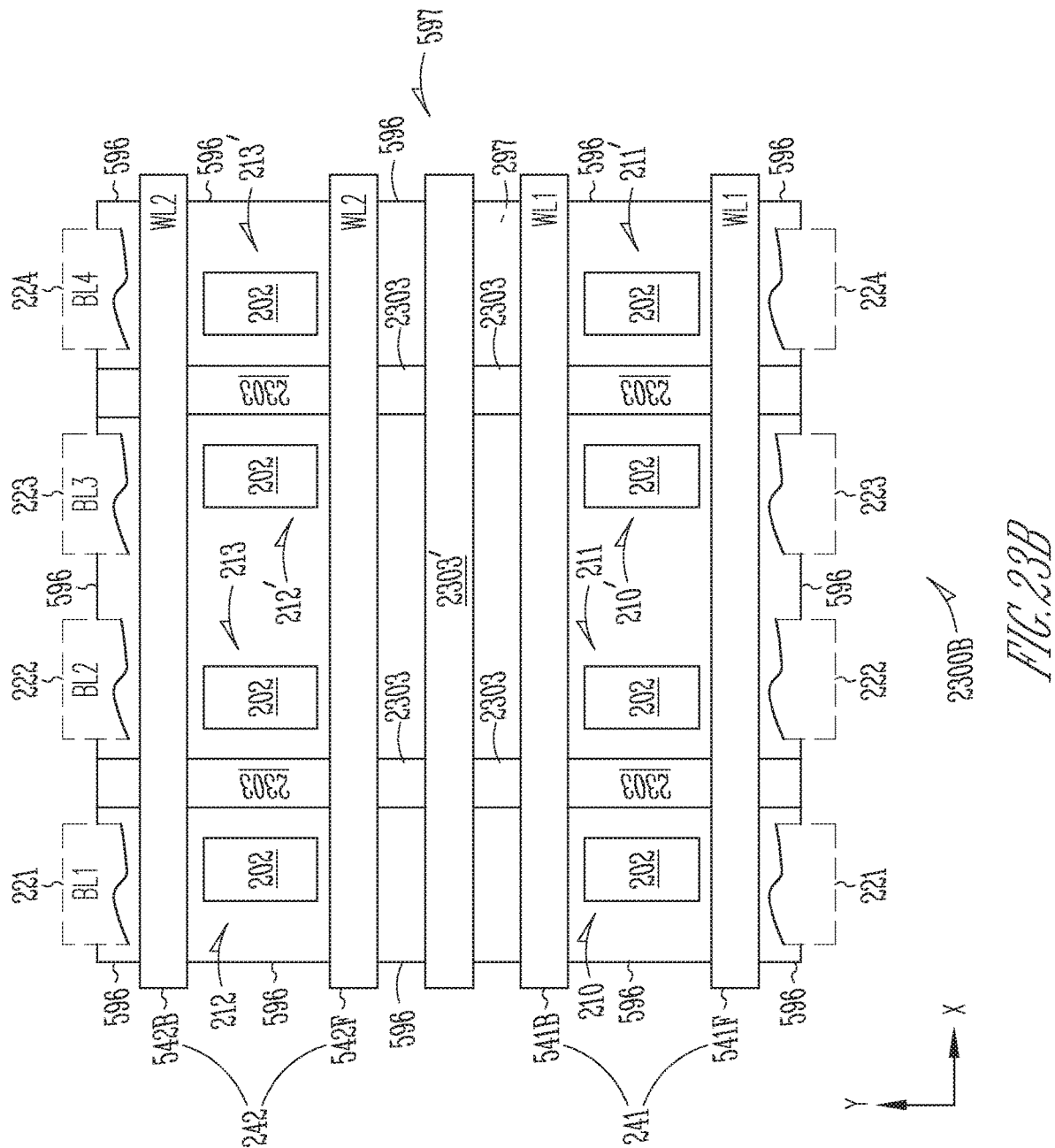

FIG. 23B shows a top view of memory device 2300B that can be a variation of the top view in FIG. 23A of memory device 2300A. As shown in FIG. 23B, memory device 2300B can include a conductive structure 2303' that can extend continuously (e.g., can have a length) in the X-direction. Conductive structure 2303' can contact (e.g., can be electrically coupled to) conductive structures 2303. Conductive structure 2303' can be located between charge storage structures 202 of memory cells 212, 213, 212', and 213' and charge storage structures 202 of memory cells 210, 211, 210', and 211'. Conductive structure 2303' can be a shield (e.g., a capacitive coupling isolation structure) between charge storage structure 202 of at least one of memory cells 212, 213, 212', and 213' and charge storage structure 202 of at least one of memory cells 210, 211, 210', and 211'.

FIG. 23B shows an example where conductive structure 2303' (e.g., the entire top portion of conductive structure 2303') can be seen from the top view in FIG. 23B (e.g., no part of a top portion of conductive structure 2303' is hidden under portions 541B and 542F of access lines 241 and 242, respectively). In an alternative structure of memory device 2300B, at least part of conductive structure 2303' (e.g., part of conductive structure 2303' or the entire conductive structure 2303') can be formed under (e.g., in the Z-direction) at least one of portions 541B and 542F (e.g., formed directly under at least one of portions 541B and 542F in the Z-direction). Thus, in the alternative structure of memory device 2300B, at least part of conductive structure 2303' (e.g., part of a top portion of conductive structure 2303' or the entire top portion of conductive structure 2303') can be hidden under at least one of portions 541B and 542F.

FIG. 24A shows a top view of memory device 2400A that can be a variation of the top view in FIG. 8B of memory device 200. As shown in FIG. 24A, memory device 2400A can include conductive structures 503 that can be the same as conductive structures 503 (FIG. 8B) of memory device 200.

Differences between memory device 200 (FIG. 8B) and memory device 2400A (FIG. 24A) include the differences between the structure of conductive region 597 (FIG. 8B) and the structures of conductive regions 597' and 597" (FIG. 24A). As described above with reference to FIG. 5 through FIG. 8B, conductive region 597 can be a common conductive plate that can be shared by (e.g., can be electrically coupled to) the memory cells (e.g., memory cells 210, 211, 212, 213, 210', 211', 212', and 213' in FIG. 8B) of memory device 200. However, conductive region 597 of FIG. 8B can be divided (as shown in FIG. 24A) into separate pieces (e.g., sub-plates) such as conductive regions 597' and 597". Each of conductive regions 597' and 597" can be shared by (e.g., can be electrically coupled to) a smaller number of memory cells in comparison with the number of memory cells that share conductive region 597 of FIG. 8B. As shown in FIG. 24A, each of conductive regions 597' and 597" can be shared by respective memory cells located in the same direction (e.g., located in the same row) in the X-direction. For example, conductive regions 597' can be shared by memory cells 210, 211, 210', and 211'. In another example, conductive regions 597" can be shared by memory cells 212, 213, 212', and 213'.

FIG. 24A shows a portion of substrate 599 at a separation (e.g., a gap) between conductive regions 597' and 597" to indicate that conductive regions 597' and 597" are separated from each other. As shown in FIG. 24A, the separation between conductive regions 597' and 597" can have a length in the X-direction (e.g., the direction parallel to the length of each of data lines 221, 222, 223, and 224), such that conductive regions 597' and 597" can located side by side with respect to the Y-direction.

Conductive region 597' can include semiconductor materials 596' and ground connection 297' (underneath semiconductor materials 596'). Conductive region 597" can include semiconductor materials 596" and ground connection 297" (underneath semiconductor materials 596"). Conductive regions 597' and 597" can be coupled to a ground connection (e.g., ground plate, not shown) of memory device 2400A. Semiconductor materials 596' and 596" can be separate portions of semiconductor materials 596 of FIG. 8B. Ground connections 297' and 297" in FIG. 24A can be separate portions of ground connection 297 of FIG. 8B.

Each of the memory cells (memory cells 210, 211, 212, 213, 210', 211', 212', and 213') of memory device 2400A can include transistors T1 and T2 (e.g., similar to transistors T1 and T2 shown in FIG. 2). In FIG. 24A, conductive region 597' can be coupled (e.g., directly coupled) to transistors T1 of memory cells 210, 211, 210', and 211'. Conductive region 597" (which is separate from conductive region 597') can be coupled (e.g., directly coupled) to transistors T1 of memory cells 212, 213, 212', and 213'.

In FIG. 24A, each of conductive structures 503 located over conductive region 597' can contact (e.g., can be electrically coupled to) conductive region 597'. Each of conductive structures 503 located over conductive region 597" can contact (e.g., can be electrically coupled to) conductive region 597".

FIG. 24A shows memory device 2400A including two conductive regions 597' and 597" (e.g., two conductive plates (e.g., sub-plates)) as an example. However, memory device 2400A can include more than two conductive regions (e.g., more than two sub-plates) similar to conductive regions 597' and 597".

Conductive structures 503 of memory device 2400A can provide improvements to memory device 2400A that can be similar to improvements provided by conductive structures 503 to memory device 200, as described above with reference to FIG. 5 through FIG. 8B.

Figure 24B:
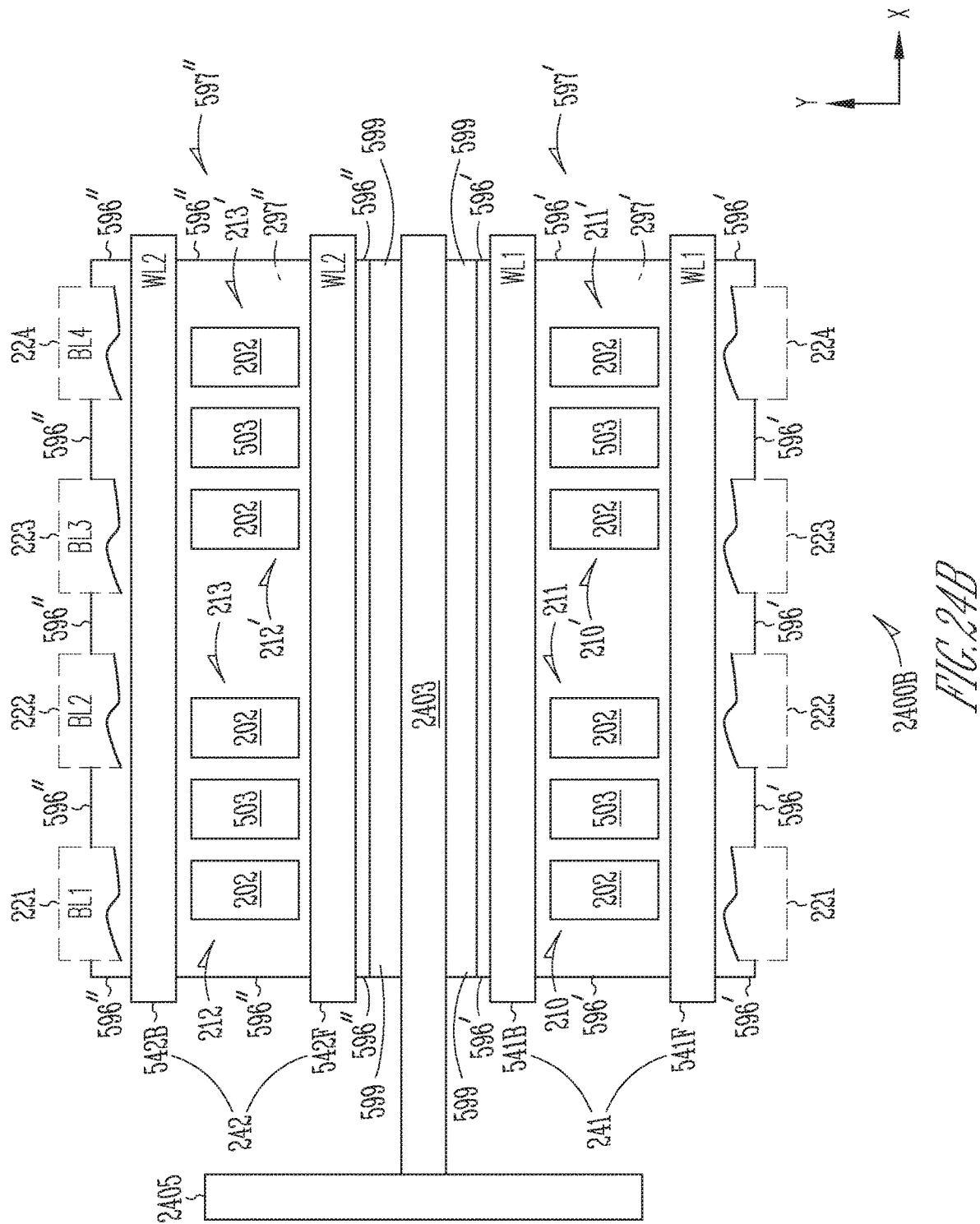

FIG. 24B shows a top view of memory device 2400B that can be a variation of the top view in FIG. 24A of memory device 2400A. As shown in FIG. 24B, memory device 2400B can include a conductive structure 2403 that can extend continuously (e.g., can have a length) in the X-direction. Conductive structure 2403 may not contact conductive regions 597' and 597'. Alternatively, conductive structure 2403 may contact at least one of conductive regions 597' and 597'. As shown in FIG. 24B, conductive structure 2403 can be located between charge storage structures 202 of memory cells 212, 213, 212', and 213' and charge storage structures 202 of memory cells 210, 211, 210', and 211'. Conductive structure 2403 can be a shield (e.g., a capacitive coupling isolation structure) between charge storage structure 202 of at least one of memory cells 212, 213, 212', and 213' and charge storage structure 202 of at least one of memory cells 210, 211, 210', and 211'.

FIG. 24B shows an example where conductive structure 2403 (e.g., the entire top portion of conductive structure 2403) can be seen from the top view in FIG. 24B (e.g., no part of a top portion of conductive structure 2403' is hidden under portions 541B and 542F of access lines 241 and 242, respectively). In an alternative structure of memory device 2400B, at least part of conductive structure 2403 (e.g., part of conductive structure 2403 or the entire conductive structure 2403) can be formed under (e.g., in the Z-direction) at least one of portions 541B and 542F (e.g., formed directly under at least one of portions 541B and 542F in the Z-direction). Thus, in the alternative structure of memory device 2400B, at least part of conductive structure 2403 (e.g., part of a top portion of conductive structure 2403 or the entire top portion of conductive structure 2403) can be hidden under at least one of portions 541B and 542F.

As shown in FIG. 24B, memory device 2400B can include a conductive segment (e.g., conductive region) 2405 that can contact (can be electrically coupled to) conductive structures 2403. Conductive segment 2405 can be coupled to a ground connection (e.g., ground plate, not shown) of memory device 2400B.

Figures 25A, 26:
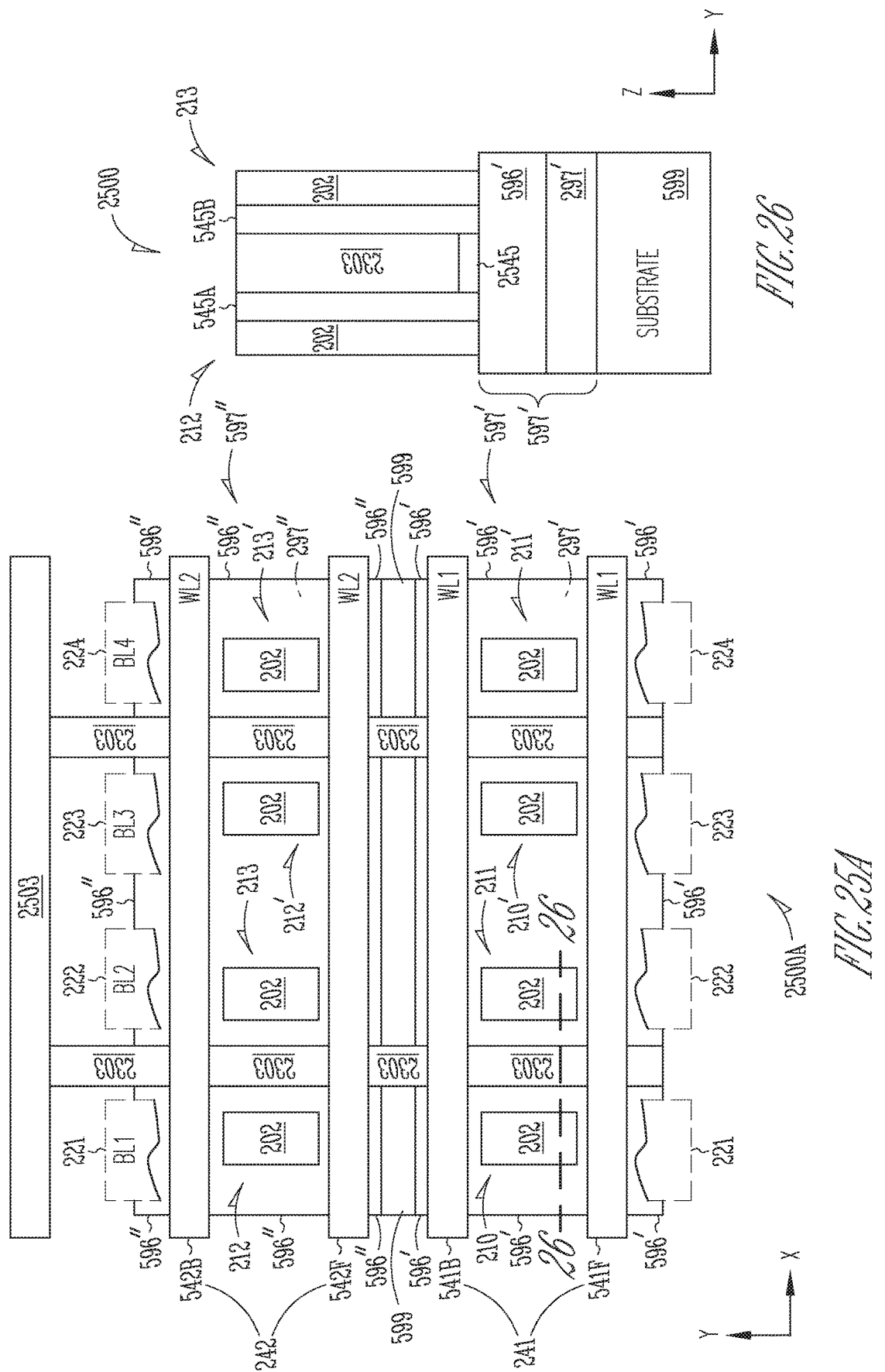

FIG. 25A shows a top view of memory device 2500A that can be a variation of the top view in FIG. 8B of memory device 200 and can include a combination of elements from memory device 2300A (FIG. 23A) and memory device 2400A (FIG. 24A). As shown in FIG. 25A, memory device 2500A can include conductive structures 2303 that can be similar to (or the same as) conductive structures 2303 of FIG. 23A. Memory device 2500A can include a conductive segment (e.g., conductive region) 2503 that can contact (can be electrically coupled to) conductive structures 2303. Conductive segment 2503 can be coupled to a ground connection (e.g., ground plate, not shown) of memory device 2500A. Memory device 2500A can also include conductive regions 597' and 597" that can be similar to (or the same as) conductive regions 597' and 597", respectively, of FIG. 24A. Line 26-26 in FIG. 25A shows a location of a portion of memory device 2500A that is shown in FIG. 26.

Figure 25B:
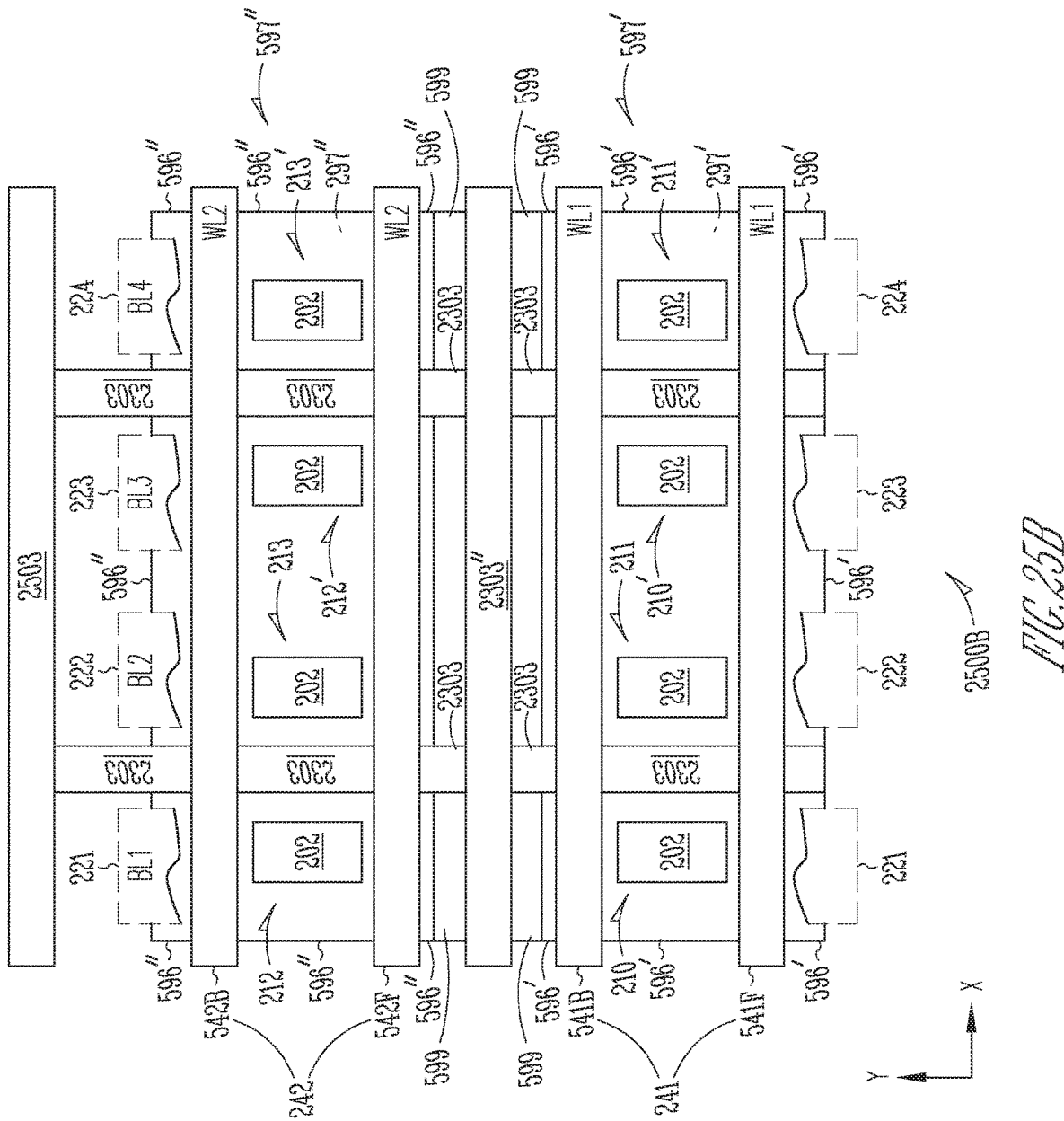

FIG. 25B shows a top view of memory device 2300B that can be a variation of the top view in FIG. 25A of memory device 2500A. As shown in FIG. 25B, memory device 2500B can include a conductive structure 2303" that can extend continuously (e.g., can have a length) in the X-direction. Conductive structure 2303''' can contact (e.g., can be electrically coupled to) conductive structures 2303. Conductive structure 2303''' can be located between charge storage structures 202 of memory cells 212, 213, 212', and 213' and charge storage structures 202 of memory cells 210, 211, 210', and 211'. Conductive structure 2303" can be a shield (e.g., a capacitive coupling isolation structure) between charge storage structure 202 of at least one of memory cells 212, 213, 212', and 213' and charge storage structure 202 of at least one of memory cells 210, 211, 210', and 211'.

FIG. 25B shows an example where conductive structure 2303" (e.g., the entire top portion of conductive structure 2303") can be seen from the top view in FIG. 23B (e.g., no part of a top portion of conductive structure 2303' is hidden under portions 541B and 542F of access lines 241 and 242, respectively). In an alternative structure of memory device 2500B, at least part of conductive structure 2303" (e.g., part of conductive structure 2303" or the entire conductive structure 2303") can be formed under (e.g., in the Z-direction) at least one of portions 541B and 542F (e.g., formed directly under at least one of portions 541B and 542F in the Z-direction). Thus, in the alternative structure of memory device 2500B, at least part of conductive structure 2303" (e.g., part of a top portion of conductive structure 2303" or the entire top portion of conductive structure 2303") can be hidden under at least one of portions 541B and 542F.

FIG. 26 shows a partial side view (e.g., cross-sectional view) of memory device 2500A along line 26-26 of FIG. 25A. Some of the elements (e.g., charge storage structures 202 and substrate 599) of memory device 2500A in FIG. 26 can be similar to (or the same as) that of the elements of memory device 200 in FIG. 7.

As shown in FIG. 26, memory device 2500A can include a dielectric (e.g., silicon dioxide) 2545 located between conductive structure 2303 and semiconductor material 596'. Memory device 2500A can also include a dielectric (e.g., silicon dioxide, not shown) similar to dielectric 2545 located between each of conductive structures 2303 and semiconductor material 596". Thus, conductive structure 2303 (located between memory cells 210 and 211 and between memory cells 212 and 213 in FIG. 25A) can be electrically separated from semiconductor materials 596' and 596" by a dielectric (e.g., dielectric 2545). Similarly, conductive structure 2303 (located between memory cells 210' and 211' and between memory cells 212' and 213' in FIG. 25A) can be electrically separated from semiconductor material 596' and 596" by a dielectric (e.g., a dielectric similar to dielectric 2545).

In comparison between FIG. 7 and FIG. 25A, conductive structure 503 of FIG. 7 can contact (can be electrically coupled to) conductive region 597. In FIG. 25A and FIG. 26, conductive structures 2303 are electrically separated from conductive regions 597' and 597" by a dielectric (e.g., dielectric 2545). However, as described above, conductive structures 2303 can contact a conductive region (e.g., conductive segment 2503) that can be coupled to a ground plate of memory device 2500A.

Conductive structures 2303 of memory device 2500A can provide improvements to memory device 2500A that can be similar to improvements provided by conductive structures 503 to memory device 200, as described above with reference to FIG. 5 through FIG. 8B.

FIG. 27A shows a top view of memory device 2700A that can be a variation of the top view in FIG. 25A of memory device 2500A. As shown in FIG. 27A, memory device 2700A can include conductive structures 2303 and conductive segment (e.g., conductive region) 2503 that can be similar to (or the same as) conductive structures 2303 and conductive segment 2503, respectively, of FIG. 25A. Memory device 2700A (FIG. 27A) can include conductive regions (e.g., sub-plates) 597''' and 597''''. Conductive region 597''' of FIG. 27A can include semiconductor materials 596' and ground connection 297'. Conductive region 597'''' can include semiconductor materials 596" and ground connection 297". Semiconductor materials 596' and 596" can be separate portions of semiconductor materials 596 of FIG. 8B. Ground connections 297' and 297" in FIG. 27A can be separate portions of ground connection 297 of FIG. 8B. Conductive regions 597''' and 597'''' can be coupled to a ground connection (e.g., ground plate, not shown) of memory device 2700A. FIG. 27A shows a portion of substrate 599 at a separation (e.g., a gap) between conductive regions 597''' and 597'''' to indicate that conductive regions 597''' and 597'''' are separated from each other.

Differences between memory device 2500A (FIG. 25A) and memory device 2700A (FIG. 27A) include the differences between the structures (e.g., orientations) conductive regions 597''' and 597'''' in FIG. 27A. As described above with reference to FIG. 24A and FIG. 25A, conductive regions 597' and 597" in FIG. 25A can be separated from each other by a separation (e.g., a gap) that has a length in the X-direction (e.g., the direction parallel to the length of each of data lines 221, 222, 223, and 224), such that conductive regions 597' and 597" can be located side by side with respect to the Y-direction. In FIG. 27A, conductive regions 597''' and 597'''' can be separated from each other by a separation (e.g., a gap) that has a length in the Y-direction (e.g., the direction perpendicular to the length of each of data lines 221, 222, 223, and 224), such that conductive regions 597''' and 597'''' can be located side by side with respect to the X-direction.

Each of conductive regions 597''' and 597'''' can be shared by a smaller number of memory cells in comparison with the number of memory cells that share conductive region 597 of FIG. 8B. As shown in FIG. 27A, each of conductive regions 597''' and 597'''' can be shared by respective memory cells located in the same direction (e.g., located in the same column) in the Y-direction. For example, conductive region 597' can be shared by memory cells 210, 211, 212, and 213. In another example, conductive regions 597" can be shared by memory cells 210', 211', 212', and 213'.

Each of the memory cells (memory cells 210, 211, 212, 213, 210', 211', 212', and 213') of memory device 2700A can include transistors T1 and T2 (e.g., similar to transistors T1 and T2 shown in FIG. 2). In FIG. 27A, conductive region 597''' can be coupled (e.g., directly coupled) to transistors T1 of memory cells 210, 211, 212, and 213. Conductive regions 597'''' (which is separate from conductive region 597''') can be coupled (e.g., directly coupled) to transistors T1 of memory cells 210', 211', 212', and 213'.

FIG. 27A shows memory device 2700A including two conductive regions 597''' and 597'''' (e.g., two conductive plates (e.g., sub-plates)) as an example. However, memory device 2700A can include more than two conductive regions (e.g., more than two sub-plates) similar to conductive regions 597''' and 597''''. Line 28-28 in FIG. 27A shows a location of a portion of memory device 2700A that is shown in FIG. 28.

Figure 27B:
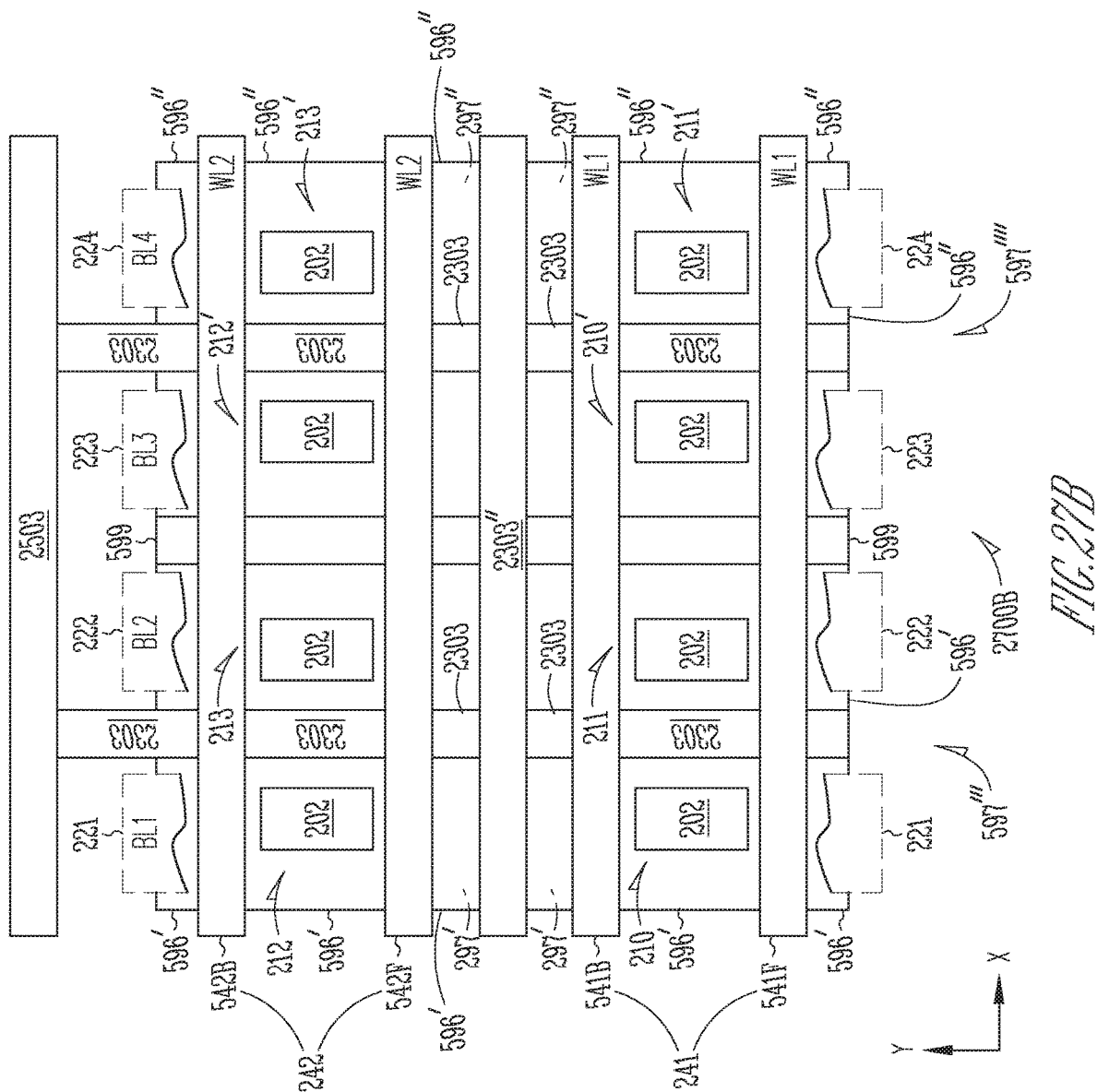

FIG. 27B shows a top view of memory device 2700B that can be a variation of the top view in FIG. 27A of memory device 2700A. As shown in FIG. 27B, memory device 2700B can include a conductive structure 2303''' that can extend continuously (e.g., can have a length) in the X-direction. Conductive structure 2303''' can contact (e.g., can be electrically coupled to) conductive structures 2303. Conductive structure 2303''' can be located between charge storage structures 202 of memory cells 212, 213, 212', and 213' and charge storage structures 202 of memory cells 210, 211, 210', and 211'. Conductive structure 2303" can be a shield (e.g., a capacitive coupling isolation structure) between charge storage structure 202 of at least one of memory cells 212, 213, 212', and 213' and charge storage structure 202 of at least one of memory cells 210, 211, 210', and 211'.

FIG. 27B shows an example where conductive structure 2303" (e.g., the entire top portion of conductive structure 2303") can be seen from the top view in FIG. 27B (e.g., no part of a top portion of conductive structure 2303" is hidden under portions 541B and 542F of access lines 241 and 242, respectively). In an alternative structure of memory device 2700B, at least part of conductive structure 2303" (e.g., part of conductive structure 2303" or the entire conductive structure 2303") can be formed under (e.g., in the Z-direction) at least one of portions 541B and 542F (e.g., formed directly under at least one of portions 541B and 542F in the Z-direction). Thus, in the alternative structure of memory device 2700B, at least part of conductive structure 2303" (e.g., part of a top portion of conductive structure 2303" or the entire top portion of conductive structure 2303") can be hidden under at least one of portions 541B and 542F.

FIG. 28 shows a partial side view (e.g., cross-sectional view) of memory device 2700A along line 28-28 of FIG. 27A. Some of the elements (e.g., charge storage structures 202 and substrate 599) of memory device 2700A in FIG. 28 can be similar to (or the same as) that of the elements of memory device 200 in FIG. 7.

As shown in FIG. 28, memory device 2700A can include a dielectric (e.g., silicon dioxide) 2745 located between conductive structure 2303 and semiconductor material 596'. Memory device 2700A can also include a dielectric (e.g., silicon dioxide, not shown) similar to dielectric 2745 located between each of conductive structures 2303 and semiconductor material 596". Thus, conductive structure 2303 (located between memory cells 210 and 211 and between memory cells 212 and 213 in FIG. 27A) can be electrically separated from semiconductor materials 596' and 596" by a dielectric (e.g., dielectric 2745). Similarly, conductive structure 2303 (located between memory cells 210' and 211' and between memory cells 212' and 213' in FIG. 27A) can be electrically separated from semiconductor material 596' and 596" by a dielectric (e.g., a dielectric similar to dielectric 2745).

In comparison between FIG. 7 and FIG. 27A, conductive structure 503 of FIG. 7 can contact (can be electrically coupled to) conductive region 597. In FIG. 27A and FIG. 28, conductive structures 2303 are electrically separated from conductive regions 597''' and 597'''' by a dielectric (e.g., dielectric 2745). However, conductive structures 2303 can contact a conductive region (e.g., conductive segment 2503) that can be coupled to a ground plate of memory device 2700A.

Conductive structures 2303 of memory device 2700A (FIG. 27A) can provide improvements to memory device 2700A that can be similar to improvements provided by conductive structures 503 to memory device 200, as described above with reference to FIG. 5 through FIG. 8B.

Figure 29A:
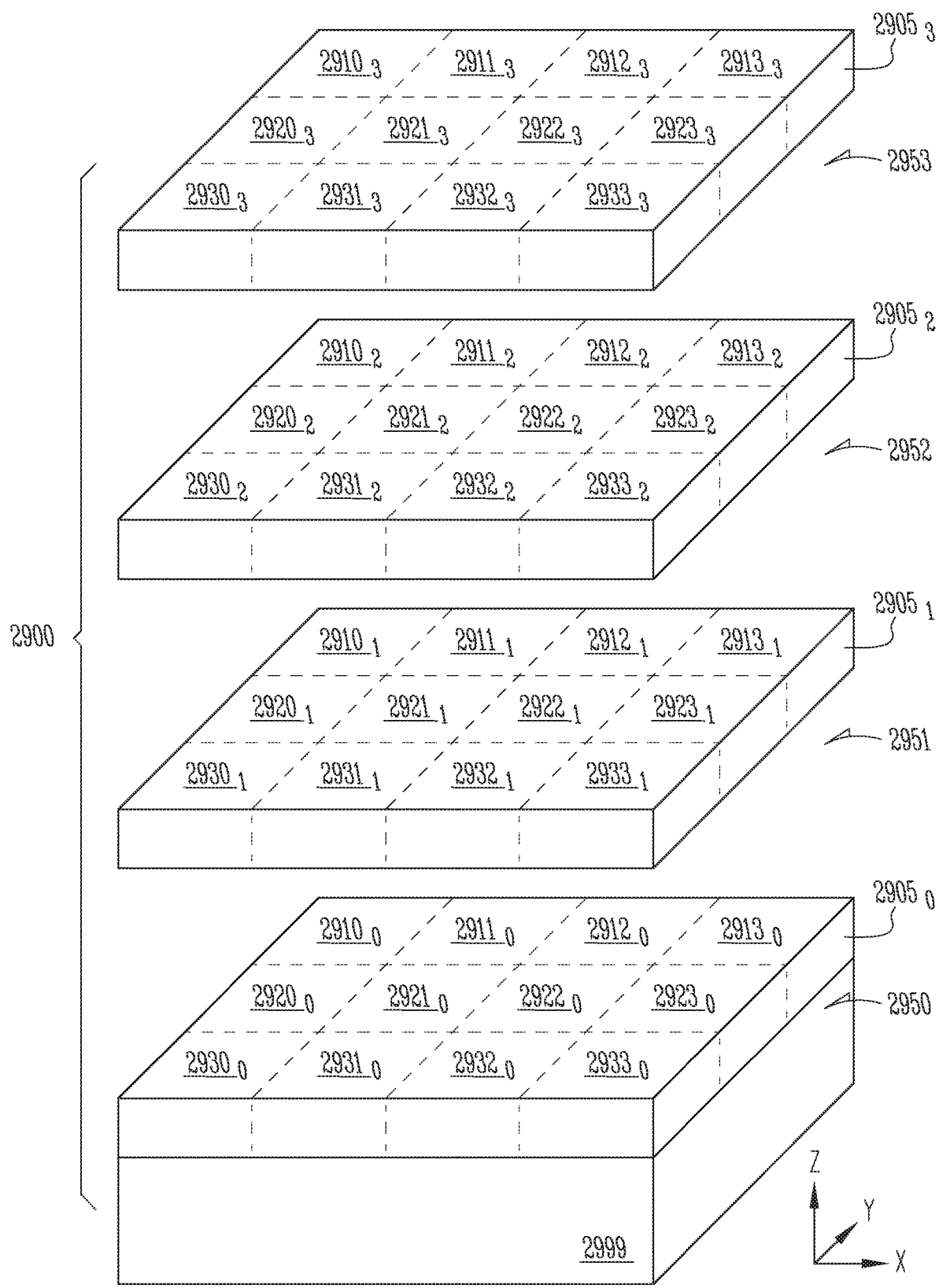
FIG. 29A, FIG. 29B, and FIG. 29C show different views of a structure of a memory device including multiple decks of memory cells, according to some embodiments described herein.
Figure 29B:
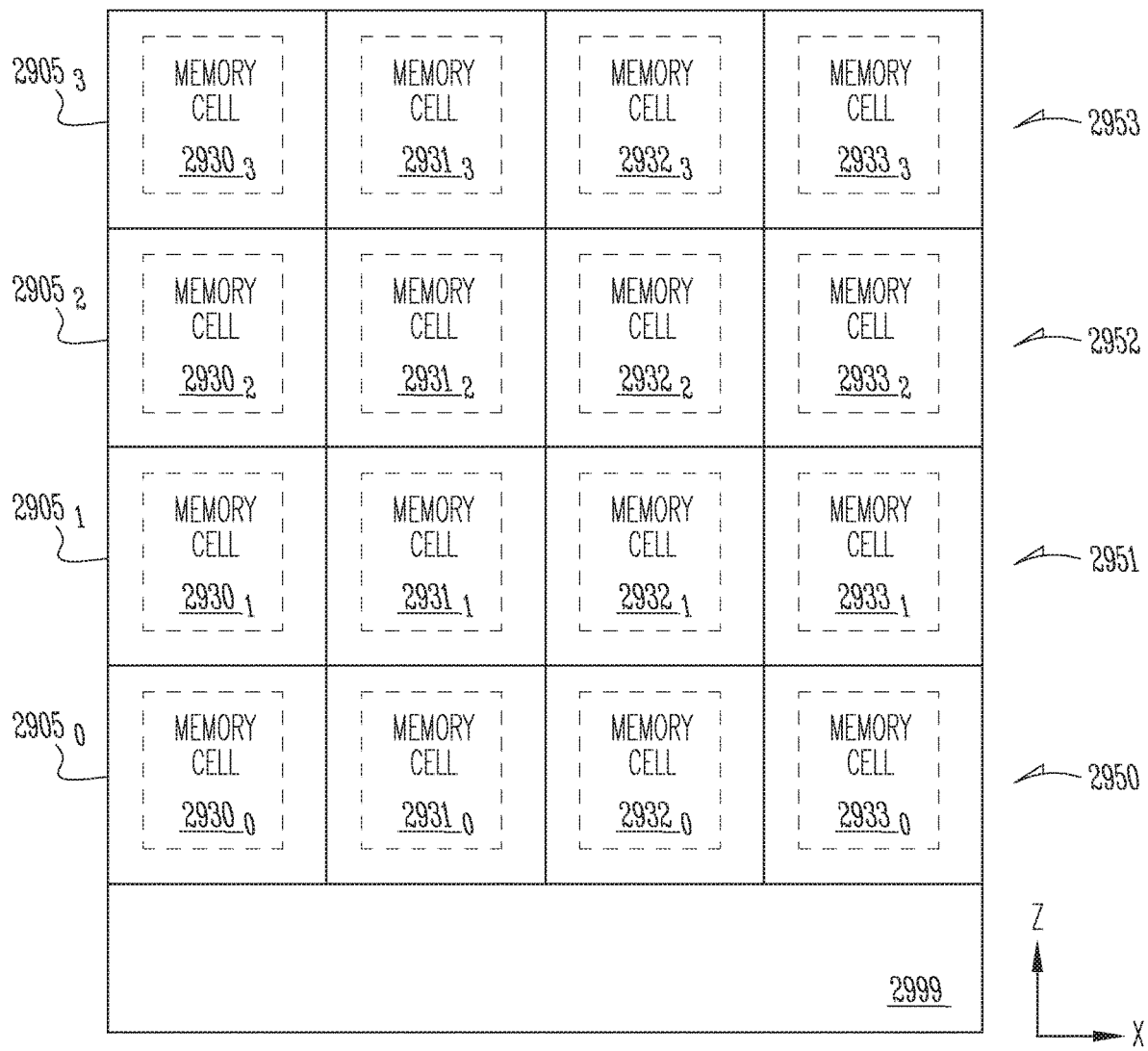
Figure 29C:
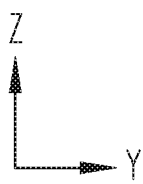

FIG. 29A, FIG. 29B, and FIG. 29C show different views of a structure of a memory device 2900 including multiple decks of memory cells, according to some embodiments described herein. FIG. 29A shows an exploded view (e.g., in the Z-direction) of memory device 2900. FIG. 29B shows a side view (e.g., cross-sectional view) in the X-direction and the Z-direction of memory device 2900. FIG. 29C shows a side view (e.g., cross-sectional view) in the Y-direction and the Z-direction of memory device 2900.

As shown in FIG. 29A, memory device 2900 can include decks (decks of memory cells) $2905_0$, $2905_1$, $2905_2$, and $2905_3$ that are shown separately from each other in an exploded view to help ease of viewing the deck structure of memory device 2900. In reality, decks $2905_0$, $2905_1$, $2905_2$, and $2905_3$ can be attached to each other in an arrangement where one deck can be formed (e.g., stacked) over another deck over a substrate (e.g., a semiconductor (e.g., silicon) substrate) 2999. For example, as shown in FIG. 29A, decks $2905_0$, $2905_1$, $2905_2$, and $2905_3$ can be formed in the Z-direction perpendicular to substrate 2999 (e.g., formed vertically in the Z-direction with respect to substrate 2999).

As shown in FIG. 29A, each of decks $2905_0$, $2905_1$, $2905_2$, and $2905_3$ can have memory cells arranged in the X-direction and the Y-direction (e.g., arranged in rows in the X-direction and in columns in the Y-direction). For example, deck $2905_0$ can include memory cells $2910_0$, $2911_0$, $2912_0$, and $2913_0$ (e.g., arranged in a row), memory cells $2920_0$, $2921_0$, $2922_0$, and $2923_0$ (e.g., arranged in a row), and memory cells $2930_0$, $2931_0$, $2932_0$, and $2933_0$ (e.g., arranged in a row).

Deck $2905_1$ can include memory cells $2910_1$, $2911_1$, $2912_1$, and $2913_1$ (e.g., arranged in a row), memory cells $2920_1$, $2921_1$, $2922_1$, and $2923_1$ (e.g., arranged in a row), and memory cells $2930_1$, $2931_1$, $2932_1$, and $2933_1$ (e.g., arranged in a row).

Deck $2905_2$ can include memory cells $2910_2$, $2911_2$, $2912_2$, and $2913_2$ (e.g., arranged in a row), memory cells $2920_2$, $2921_2$, $2922_2$, and $2923_2$ (e.g., arranged in a row), and memory cells $2930_2$, $2931_2$, $2932_2$, and $2933_2$ (e.g., arranged in a row).

Deck $2905_3$ can include memory cells $2910_3$, $2911_3$, $2912_3$, and $2913_3$ (e.g., arranged in a row), memory cells $2920_3$, $2921_3$, $2922_3$, and $2923_3$ (e.g., arranged in a row), and memory cells $2930_3$, $2931_3$, $2932_3$, and $2933_3$ (e.g., arranged in a row).

As shown in FIG. 29A, decks $2905_0$, $2905_1$, $2905_2$, and $2905_3$ can be located (e.g., formed vertically in the Z-direction) on levels (e.g., portions) 2950, 2951, 2952, and 2953, respectively, of memory device 2900. The arrangement of decks $2905_0$, $2905_1$, $2905_2$, and $2905_3$ forms a 3-dimensional (3-D) structure of memory cells of memory device 2900 in that different levels of the memory cells of memory device 2900 can be located (e.g., formed) in different levels (e.g., different vertical portions) 2950, 2951, 2952, and 2953 of memory device 2900.

Decks $2905_0$, $2905_1$, $2905_2$, and $2905_3$ can be formed one deck at a time. For example, decks $2905_0$, $2905_1$, $2905_2$, and $2905_3$ can be formed sequentially in the order of decks $2905_0$, $2905_1$, $2905_2$, and $2905_3$ (e.g., deck $2905_1$ is formed first and deck $2905_3$ is formed last). In this example, the memory cell of one deck (e.g., deck $2905_1$) can be formed either after formation of the memory cells of another deck (e.g., deck $2905_0$) or before formation of the memory cells of another deck (e.g., deck $2905_2$). Alternatively, decks $2905_0$, $2905_1$, $2905_2$, and $2905_3$ can be formed concurrently (e.g., simultaneously), such that the memory cells of decks $2905_0$, $2905_1$, $2905_2$, and $2905_3$ can be concurrently formed. For example, the memory cells in levels 2950, 2951, 2952, and 2953 of memory device 2900 can be concurrently formed.

The structures of the memory cells of each of decks $2905_0$, $2905_1$, $2905_2$, and $2905_3$ can include the structures of the memory cells described above with reference to FIG. 1 through FIG. 28. For example, the structures of the memory cells of decks $2905_0$, $2905_1$, $2905_2$, and $2905_3$ can include the structure of the memory cells of memory devices 200, 900, and 2300A.

Memory device 2900 can include data lines (e.g., bit lines) and access lines (e.g., word lines) to access the memory cells of decks $2905_0$, $2905_1$, $2905_2$, and $2905_3$. For simplicity, data lines and access lines of memory cells are omitted from FIG. 29A. However, the data lines and access lines of memory device 2900 can be similar to the data lines and access lines, respectively, of the memory devices described above with reference to FIG. 1 through FIG. 28.

FIG. 29A shows memory device 2900 including four decks (e.g., $2905_0$, $2905_1$, $2905_2$, and $2905_3$) as an example. However, the number of decks can be different from four. FIG. 29A shows each of decks $2905_0$, $2905_1$, $2905_2$, and $2905_3$ including one level (e.g., layer) of memory cells as an example. However, at least one of the decks (e.g., one or more of decks $2905_0$, $2905_1$, $2905_2$, and $2905_3$) can have two (or more) levels of memory cells. FIG. 29A shows an example where each of decks $2905_0$, $2905_1$, $2905_2$, and $2905_3$ includes four memory cells (e.g., in a row) in the X-direction and three memory cells (e.g., in a column) in the Y-direction. However, the number of memory cells in a row, in a column, or both, can vary.

The illustrations of apparatuses (e.g., memory devices 100, 200, 900, 2300A, 2300B, 2400A, 2400B, 2500A, 2500B, 2700A, 2700B, and 2900) and methods (e.g., operations of memory devices 100 and 200, and methods of forming memory device 900) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 900, 2300A, 2300B, 2400A, 2400B, 2500A, 2500B, 2700A, 2700B, and 2900) or a system (e.g., an electronic item that can include any of memory devices 100, 200, 900, 2300A, 2300B, 2400A, 2400B, 2500A, 2500B, 2700A, 2700B, and 2900).

Any of the components described above with reference to FIG. 1 through FIG. 29C can be implemented in a number of ways, including simulation via software. Thus, apparatuses (e.g., memory devices 100, 200, 900, 2300A, 2300B, 2400A, 2400B, 2500A, 2500B, 2700A, 2700B, and 2900) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 900, 2300A, 2300B, 2400A, 2400B, 2500A, 2500B, 2700A, 2700B, and 2900) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 29C include apparatuses and methods of forming the apparatuses. One of the apparatuses includes a conductive region, a first data line, a second data line, a first memory cell coupled to the first data line and the conductive region, a second memory cell coupled to the second data line and the conductive region, a conductive structure, and a conductive line. The first memory cell includes a first transistor coupled to a second transistor, the first transistor includes a first charge storage structure. The second memory cell includes a third transistor coupled to a fourth transistor, the third transistor includes a second charge storage structure. The conductive structure is located between and electrically separated from the first and second charge storage structures. The conductive line forms a gate of the each of the first, second, third, and fourth transistors. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a conductive region;
   a first data line;
   a second data line;
   a first memory cell including a first transistor and a second transistor, the first transistor including a first channel region coupled between the first data line and the conductive region, and a first charge storage structure located between the first data line and the conductive region and electrically separated from the first channel region, the second transistor including a second channel region coupled to and located between the first data line and the first charge structure;
   a second memory cell including a third transistor and a fourth transistor, the third transistor including a third channel region coupled between the second data line and the conductive region, and a second charge storage structure located between the second line and the conductive region and electrically separated from the third channel region, the fourth transistor including a fourth channel region coupled to and located between the second data line and the second charge structure;
   a conductive structure located between and electrically separated from the first and second charge storage structures; and
   a conductive line forming a gate of each of the first, second, third, and fourth transistors.

2. The apparatus of claim 1, wherein the conductive structure comprises one of metal and conductively doped poly silicon.

3. The apparatus of claim 1, wherein the second channel region comprises a same material as the fourth channel region.

4. The apparatus of claim 1, wherein each of the second and fourth channel regions comprises a semiconducting oxide material.

5. The apparatus of claim 1, wherein the first and third channel regions comprise a first material, and the second and fourth channel regions comprise a second material different from the first material.

6. The apparatus of claim 1, wherein the conductive region is coupled to a ground connection.

7. The apparatus of claim 1, wherein the conductive structure contacts the conductive region.

8. The apparatus of claim 1, wherein the conductive structure is electrically separated from the conductive region.

9. The apparatus of claim 1, further comprising:
a third memory cell including a first additional transistor and a second additional transistor, the first additional transistor including a first additional channel region coupled between the first data line and the conductive region, and a first additional charge storage structure electrically separated from the first additional channel region, the second additional transistor including a second additional channel region coupled between the first data line and the first additional charge storage structure;
a fourth memory cell including a third additional transistor and a fourth additional transistor, the third additional transistor including a third additional channel region coupled between the second data line and the conductive region, and a second additional charge storage structure electrically separated from the third additional channel region, the fourth additional transistor including a fourth additional channel region coupled between the second data line and the second additional charge storage structure; and
wherein the conductive structure extends between and is electrically separated from the first additional charge storage structure and the second additional charge storage structure.

10. The apparatus of claim 9, further comprising:
an additional conductive structure extending in a direction perpendicular to the conductive structure, the additional conductive structure extending between and electrically separated from the first and second charge storage structures and from the first and second additional charge storage structures.

11. The apparatus of claim 1, further comprising:
a third memory cell including a first additional transistor and a second additional transistor, the first additional transistor including a first additional channel region coupled between the first data line and the conductive region, and a first additional charge storage structure electrically separated from the first additional channel region, the second additional transistor including a second additional channel region coupled between the first data line and the first additional charge storage structure;
a fourth memory cell including a third additional transistor and a fourth additional transistor, the third additional transistor including a third additional channel region coupled between the second data line and the conductive region, and a second additional charge storage structure electrically separated from the third additional channel region, the fourth additional transistor including a fourth additional channel region coupled between the second data line and the second additional charge storage structure;
a first additional conductive structure located between and electrically separated from the first and second additional charge storage structures;
an additional conductive line forming a gate of each of the first, second, third, and fourth additional transistors, the conductive line and the additional conductive line located between the first memory cell and the first additional memory cell; and a second additional conductive structure extending in a direction from the first memory cell to the second memory cell, and the second additional conductive structure electrically separated from the first and second charge storage structures and from the first and second additional charge storage structures.

12. The apparatus of claim 1, wherein the conductive region is a first conductive region, and the apparatus further comprising:
a second conductive region separated from the first conductive region;
a third memory cell including a first additional transistor and a second additional transistor, the first additional transistor including a first additional channel region coupled between the first data line and the second conductive region, and a first additional charge storage structure electrically separated from the first additional channel region, the second additional transistor including a second additional channel region coupled between the first data line and the first additional charge storage structure;
a fourth memory cell including a third additional transistor and a fourth additional transistor, the third additional transistor including a third additional channel region coupled between the second data line and the second conductive region, and a second additional charge storage structure electrically separated from the third additional channel region, the fourth additional transistor including a fourth additional channel region coupled between the second data line and the second additional charge storage structure; and
wherein the conductive structure extends between and electrically separated from the first additional charge storage structure and the second additional charge storage structure.

13. An apparatus comprising:
a conductive region located in a first level of the apparatus;
a first additional conductive region located in a second level of the apparatus;
a second additional conductive region located in the second level and electrically separated from the first additional conductive region;
a first memory cell located between the first and second levels and including a first charge storage structure, a first channel region contacting the first charge storage structure and the first additional conductive region, and a first semiconductor material contacting the first additional conductive region and the conductive region;
a second memory cell located between the first and second levels and including a second charge storage structure, a second channel region contacting the second charge storage structure and the second additional conductive region, and a second semiconductor material contacting the second additional conductive region and the conductive region;
a conductive structure located between and electrically separated from the first and second charge storage structures; and
a conductive line electrically separated from the first and second charge storage structures, the first and second channel regions, and the first and second semiconductor materials, the conductive line spanning across part of each of the first semiconductor material, the first channel region, the second semiconductor material, and the second channel region.

14. The apparatus of claim 13, wherein:
the first additional conductive region is part of a first data line of the apparatus; and
the second additional conductive region is part of a second data line of the apparatus.

15. The apparatus of claim 13, wherein the conductive line is part of an access line of the apparatus.

16. The apparatus of claim 13, wherein the conductive line further spans across part of each of the first and second charge storage structures.

17. The apparatus of claim 13, wherein the conductive structure contacts the conductive region.

18. The apparatus of claim 13, wherein the conductive structure is electrically separated from the conductive region.

19. The apparatus of claim 13, wherein the conductive structure comprises metal.

20. The apparatus of claim 13, wherein the conductive structure comprises polysilicon of p-type conductivity.

21. The apparatus of claim 13, wherein the conductive structure comprises poly silicon of n-type conductivity.

22. The apparatus of claim 13, wherein the channel region comprises at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

* * * * *